(12) United States Patent
Nishiwaki et al.

(10) Patent No.: US 8,294,076 B2
(45) Date of Patent: Oct. 23, 2012

(54) IMAGING DEVICE WITH COLUMNAR OR PLATE-LIKE TRANSPARENT REFRACTIVE INDEX LAYERS

(75) Inventors: Seiji Nishiwaki, Hyogo (JP); Masa-aki Suzuki, Osaka (JP); Shin-ichi Wakabayashi, Osaka (JP); Kazuya Yonemoto, Osaka (JP); Masao Hiramoto, Osaka (JP)

(73) Assignee: Panasonic Corporation, Osaka (JP)

( * ) Notice: Subject to any disclaimer, the term of this patent is extended or adjusted under 35 U.S.C. 154(b) by 355 days.

(21) Appl. No.: 12/675,016

(22) PCT Filed: Jul. 24, 2009

(86) PCT No.: PCT/JP2009/003500
§ 371 (c)(1),
(2), (4) Date: Feb. 24, 2010

(87) PCT Pub. No.: WO2010/016195
PCT Pub. Date: Feb. 11, 2010

(65) Prior Publication Data
US 2011/0192962 A1 Aug. 11, 2011

(30) Foreign Application Priority Data
Aug. 5, 2008 (JP) .................. 2008-202159

(51) Int. Cl.
*H01L 27/00* (2006.01)
*H01J 5/02* (2006.01)
(52) U.S. Cl. .................... 250/208.1; 250/239
(58) Field of Classification Search ............ 250/208.1, 250/214.1, 216, 226, 239; 348/272, 273, 348/276–280, 290–291; 257/432–435, 443, 257/640–651, 760; 359/494, 495, 566, 569, 359/576, 586–590
See application file for complete search history.

(56) References Cited

U.S. PATENT DOCUMENTS

| 4,255,019 A | 3/1981 | Knop |
| 4,755,667 A * | 7/1988 | Marsoner et al. ........ 250/227.24 |
| 2003/0156210 A1 | 8/2003 | Wako et al. |
| 2009/0115011 A1 | 5/2009 | Ushiro et al. |

FOREIGN PATENT DOCUMENTS

| JP | 10-163465 | 6/1998 |
| JP | 2002-502120 | 1/2002 |
| JP | 2005-109001 | 4/2005 |
| JP | 2005-167356 | 6/2005 |
| JP | 2005-286034 | 10/2005 |
| JP | 2007-109801 | 4/2007 |
| WO | 99/39372 | 8/1999 |

* cited by examiner

*Primary Examiner* — Que T Le
*Assistant Examiner* — Don Williams
(74) *Attorney, Agent, or Firm* — Hamre, Schumann, Mueller & Larson, P.C.

(57) ABSTRACT

An imaging photodetection device (4) includes: a plurality of photodetectors (6) that are arrayed on a substrate (5) at least along a first direction; a transparent low refractive index layer (12) that is formed above the plurality of photodetectors; and a plurality of transparent high refractive index sections (13) that are embedded in the transparent low refractive index layer along the first direction. On a cross-section of the transparent high refractive index sections orthogonal to the substrate and along the first direction, central axes (14) of the transparent high refractive index sections are bent stepwise. Light that enters the transparent low refractive index layer and the transparent high refractive index section passes therethrough to be separated into $0^{th}$-order diffracted light, $1^{st}$-order diffracted light, and $-1^{st}$-order diffracted light. Thereby, improvement in the efficiency of light utilization and pixel densification can be realized.

16 Claims, 26 Drawing Sheets

IMAGING DEVICE WITH COLUMNAR OR PLATE-LIKE TRANSPARENT REFRACTIVE INDEX LAYERS

TECHNICAL FIELD

The present invention relates to an imaging photodetection device used for picking up an image of an object.

BACKGROUND ART

Conventional imaging photodetection devices are disclosed for example in Non-Patent Documents 1 and 2. The imaging photodetection devices disclosed therein will be described below in brief.

FIG. 17A is a side view showing a schematic configuration of a conventional imaging device. A light beam such as natural light enters an object 1, and the light beam reflected thereby forms an image 3 on a photodetection device 4 such as a CCD or a CMOS through a lens system 2. Though the lens system 2 is composed typically by combining a plurality of lenses aligned along an optical axis in order to ensure the optical performance, the lens system 2 is shown schematically as a single lens in FIG. 17A.

FIG. 17B is a magnified cross-sectional view of a portion XVIIB in FIG. 17A, showing a schematic configuration of the photodetection device 4. A transparent low refractive index buffer layer 7 made of $SiO_2$ or the like, a transparent high refractive index buffer layer 8 made of SiN or the like, a plurality of color filters 9 and a plurality of microlenses 10 are laminated in this order on a detection substrate 5 where a plurality of photodetectors 6 have been formed. An uneven structure is provided on a surface 7a of the transparent buffer layer 7 in contact with the transparent buffer layer 8 so that the thickness of the transparent buffer layer 7 is reduced at each of the photodetectors 6. In contrast, a surface 8a of the transparent buffer layer 8 in contact with the color filters 9 is planar.

The microlenses 10 are arranged at the respective intersections of an orthogonal grid, and one color filter 9 and one photodetector 6 are arranged on the central axis of each microlens 10.

The microlenses 10 function so as to refract light such as a light beam 11a' that enters with a shift relative to the central axis of the microlens 10 and guide the light to the photodetector 6. The uneven structure on the surface 7a of the transparent buffer layer 7 also has a lens effect, thereby refracting a divergent light beam 11b' that travels in a direction away from the center of the photodetector 6 and guiding it to the photodetector 6.

The color filters 9 are composed of three kinds of filters, namely, a red transmission filter 9R, a green transmission filter 9G and a blue transmission filter 9B. The red transmission filter 9R has a light transmission characteristic (spectral sensitivity characteristic) of cutting (absorbing) light of a wavelength other than red, as illustrated with a curve R in FIG. 18; the green transmission filter 9G has a light transmission characteristic (spectral sensitivity characteristic) of cutting (absorbing) light of a wavelength other than green, as illustrated with a curve G in FIG. 18; and the blue transmission filter 9B has a light transmission characteristic (spectral sensitivity characteristic) of cutting (absorbing) light of a wavelength other than blue, as illustrated with a curve B in FIG. 18 (see Non-Patent Document 2). A color pixel for detecting color image information is configured with four color filters 9 composed of the red transmission filter 9R, the green transmission filter 9G, the blue transmission filter 9B, and a green transmission filter 9G for brightness detection, and also four photodetectors 6 corresponding to the color filters 9. An array of the photodetectors 6 corresponding to the four color filters 9 is shown in FIG. 19. In FIG. 19, R indicates a photodetector corresponding to the red transmission filter 9R and detecting a red color, G indicates a photodetector corresponding to the green transmission filter 9G and detecting a green color, and B indicates a photodetector corresponding to the blue transmission filter 9B and detecting a blue color. One color pixel 19 is configured with four basic pixels forming 2 columns×2 rows in which two green pixels (basic pixels G) are arranged at one pair of opposing corners and one blue pixel (basic pixel B) and one red pixel (basic pixel R) are arranged at the other pair of opposing corners. This array is referred to as a Bayer array, and is advantageous in that a color pixel 19' can be formed also at a position obtained by shifting in the vertical direction (X-axis direction) or the horizontal direction (Y-axis direction) by half the size of the color pixel 19 (the size of a basic pixel). Accordingly, the resolution is improved to half the size of the color pixel 19 (¼ the area of the color pixel 19), that is, the size of a basic pixel.

FIG. 20 is a magnified plan view of a detection plane of the optical detection device 4. The plurality of photodetectors 6 are arranged at the intersections of the orthogonal grid in a state spaced away and insulated from each other. Between the photodetectors 6 adjacent horizontally to each other, a plurality of vertical transfer CCDs 17 as signal wires extending vertically are provided, and the plurality of vertical transfer CCDs 17 are connected to a horizontal transfer CCD 18 as a signal wire extending horizontally. Light focused by the microlens 10 is received by the photodetector 6 located directly below the microlens 10, and photoelectrically converted. Electric charge stored in the photodetector 6 is sent to the vertical transfer CCDs 17 and further sent to the horizontal transfer CCD 18 so as to be output as an image signal.

In the photodetection device 4 as shown in FIG. 17B, the color filters 9 are used to let light of a specific color enter each of the photodetectors 6. On the other hand, a photodetection device as shown in FIG. 21 is suggested, which uses a microprism 31 in order to disperse a light beam 30 coming from a photographic subject and transmitted through a microlens (not shown), and detects the light beams of respective colors of red (R), green (G) and blue (B) with photodetectors 32R, 32G and 32B (see Patent document 1).

Citation List
Patent Document
  Patent Document 1: JP 2002-502120A (Tokuhyo)
Non-Patent Documents
  Non-Patent Document 1: 'Optical and Electro-Optical Engineering Contact', vol. 40, No. 1 (2002), p. 24
  Non-Patent Document 2: 'Transistor Gijutsu', February 2003, p. 128

SUMMARY OF INVENTION

Problem to be Solved by the Invention

Demands for miniaturization and an increased number of pixels have increased regarding imaging photodetection devices. However, there is a limitation to satisfying such demands with the above-mentioned conventional imaging photodetection devices due to the reasons below.

The first reason is that the color separation is carried out by using the color filters 9 in the conventional imaging photodetection device as shown in FIG. 17B. For example, since light of a wavelength other than blue is absorbed by the blue transmission filter 9B, as clearly shown in FIG. 18, only about 20 to 30% of incident light passes through the blue transmission filter 9B. The same can be said of the other color filters 9R and 9G. When the spacing between the photodetectors 6 is reduced to increase the number of pixels, the sizes of the photodetectors 6 and the microlenses 10 are reduced. Thereby, the amount of light that enters one microlens 10 is reduced, furthermore most of the light is absorbed by the color filters 9, and, thus, a sufficient amount of light cannot be fed to the photodetectors 6. As a result, a detection signal will be hidden among noise signals such as optical shot noise. Therefore, in a conventional imaging photodetection device, it is held that the lower limit for the spacing between the photodetectors 6 is about 1.5 µm.

The second reason is that microlenses 10 are arranged in a one-to-one correspondence with the photodetectors 6 in the conventional imaging photodetection device as shown in FIG. 17B. When the spacing between the photodetectors 6 is reduced to increase the number of pixels, the size of the microlenses 10 is reduced, and, thus, the size of the light flux passing through the microlens 10 is reduced. Just like the flare angle of light passing through a pinhole is inversely proportional to the pinhole diameter, the characteristic that the light is diffused (diffracted) is enhanced excessively when the size of the light flux (i.e., the diameter of the microlens 10) is reduced considerably, and, thus, it is difficult to obtain the desired focusing performance by using the microlenses 10. For the purpose of obtaining the focusing performance of the microlenses 10, the microlens 10 is required to have a diameter at least twice or triple the wavelength. This has been an obstacle in increasing the number of pixels.

In the conventional photodetection device as shown in FIG. 21, the efficiency of light utilization is improved since a color filter that absorbs light is not used. However, the spectral action (difference in the refractive angle by wavelength) utilizing the dispersion characteristic of a prism is extremely small, and the displacement between red light and green light or the displacement between green light and blue light is extremely small. Therefore, in a case of using a prism to separate light into its spectral components, it is necessary to set the spacing between the prism and the photodetection plane to be at least tens to hundreds of micrometers or more, which is not a practical dimension in trial production.

Therefore, with the foregoing in mind, it is an object of the present invention to solve the above-mentioned problems in the prior art, reduce drastically the spacing between photodetectors by improving the efficiency of light utilization, and realize both the establishment of the size required for microlenses and an increase in the pixel density. Another object of the present invention is to realize a practically dimensioned photodetection device by utilizing a large spectral action.

Means for Solving Problem

The present invention is directed to an imaging photodetection device, including: a plurality of photodetectors that are arrayed on a substrate at least along a first direction; a transparent low refractive index layer that is formed above the plurality of photodetectors; and a plurality of columnar or plate-like transparent high refractive index sections that are embedded in the transparent low refractive index layer along the first direction. Central axes of the transparent high refractive index sections are bent stepwise on a cross-section of the transparent high refractive index sections orthogonal to the substrate and along the first direction. Light that enters the transparent low refractive index layer and the transparent high refractive index section passes therethrough to be separated into $0^{th}$-order diffracted light, $1^{st}$-order diffracted light and $-1^{st}$-order diffracted light.

Effects of the Invention

As the imaging photodetection device of the present invention carries out the color separation of light not through optical absorption but through optical diffraction, the efficiency of light utilization is improved drastically. Moreover, two kinds or three kinds of color information can be detected per microlens. Therefore, the size of the microlenses can be ensured and at the same time, the pixel density can be increased. Further, since spectra are obtained by utilizing the difference in the diffractive angle by wavelength, the spacing between a transparent high refractive index section and a photodetector can be reduced to realize a practical dimension.

FIG. WA is a view showing another example of a cross-sectional shape of a transparent high refractive index section in the imaging photodetection device of the present invention.

Figure 16A:
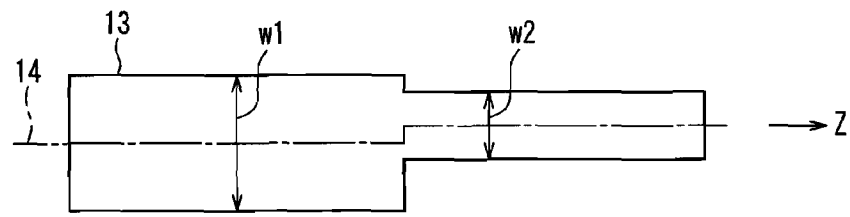
Figure 16B:
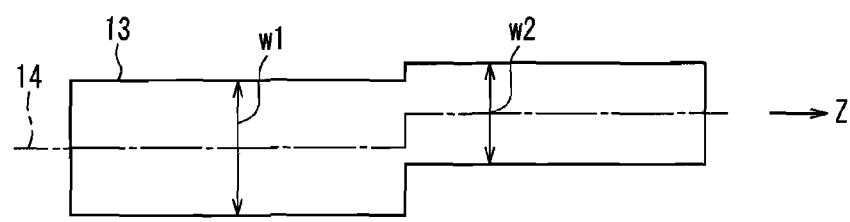

FIG. 16B is a view showing yet another example of a cross-sectional shape of a transparent high refractive index section in the imaging photodetection device of the present invention.

Figure 16C:
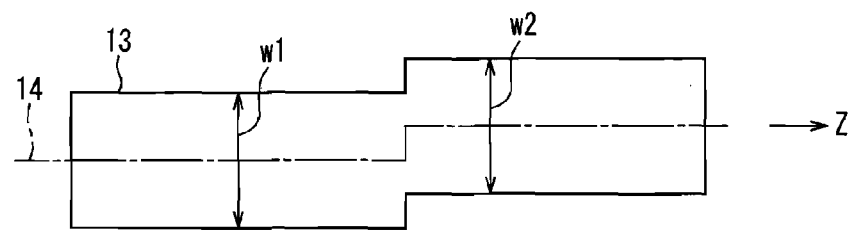

FIG. 16C is a view showing yet another example of a cross-sectional shape of a transparent high refractive index section in the imaging photodetection device of the present invention.

Figure 16D:
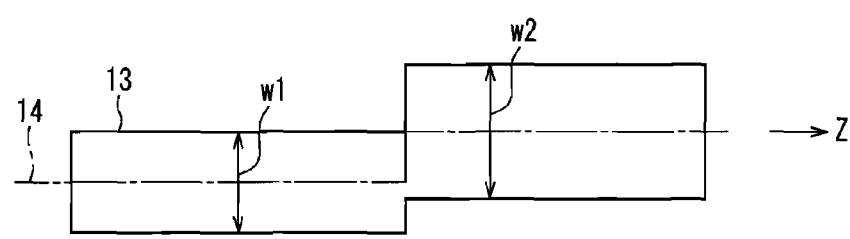

FIG. 16D is a view showing yet another example of a cross-sectional shape of a transparent high refractive index section in the imaging photodetection device of the present invention.

Figure 16E:
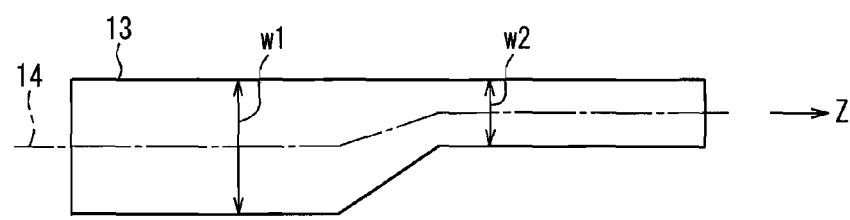

FIG. 16E is a view showing yet another example of a cross-sectional shape of a transparent high refractive index section in the imaging photodetection device of the present invention.

Figure 17A:
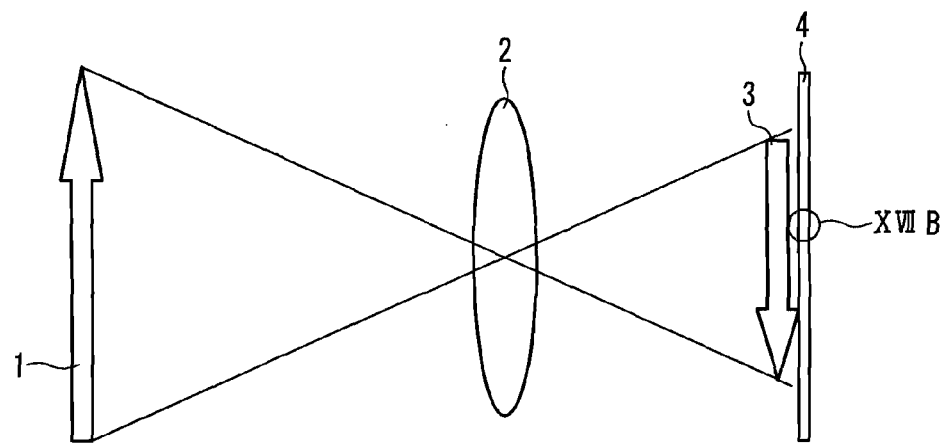

FIG. 17A is a side view showing a schematic configuration of a conventional imaging device.

Figure 17B:
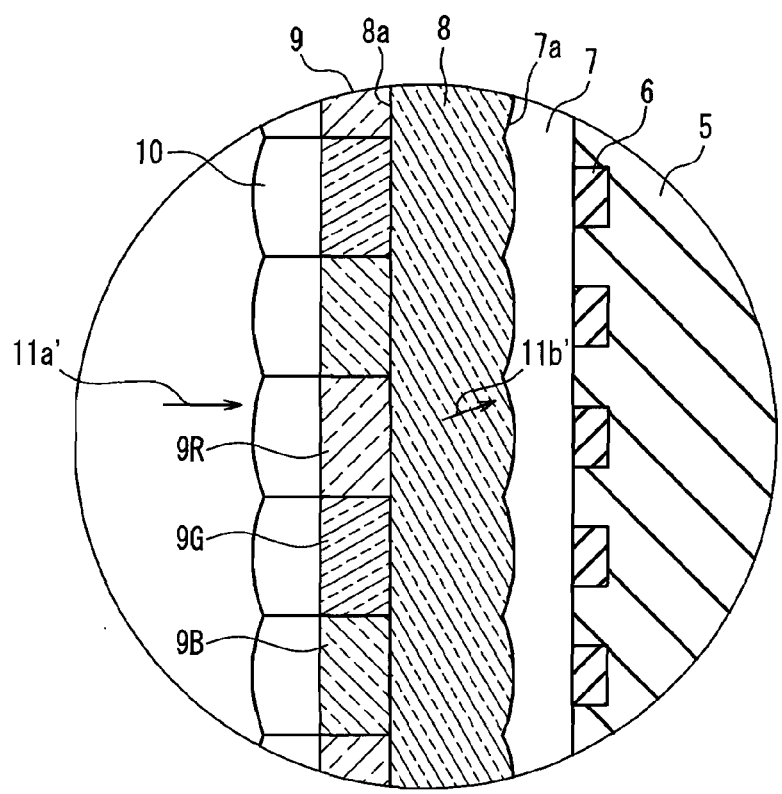

FIG. 17B is a magnified cross-sectional view of a portion XVIIB in FIG. 17A, showing a schematic configuration of a conventional imaging photodetection device.

Figure 18:
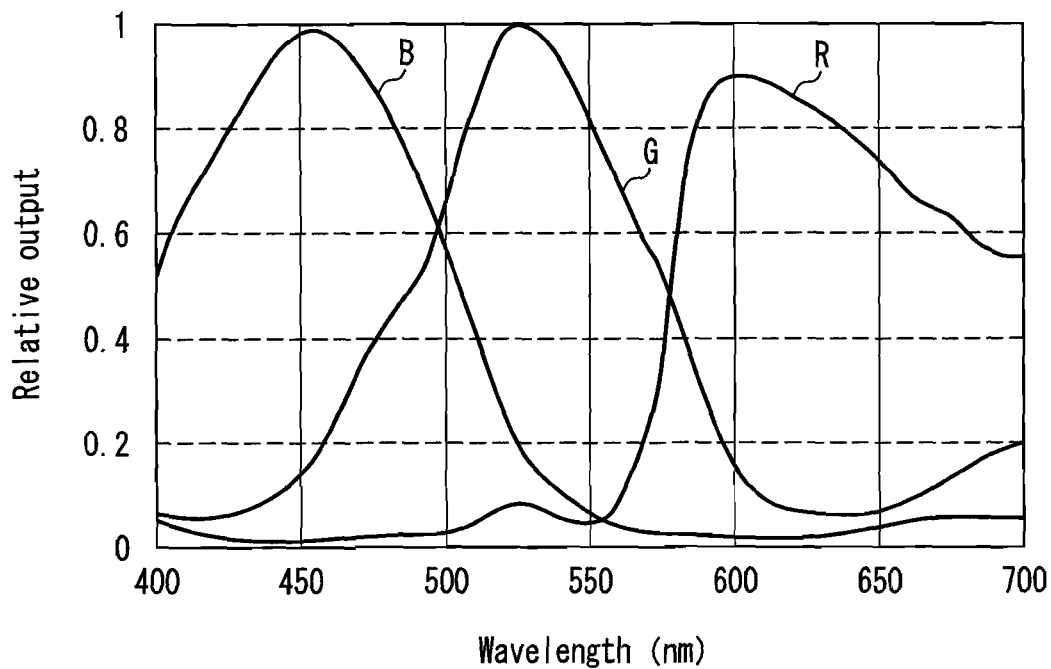

FIG. 18 is a graph showing the spectral sensitivity characteristics of three kinds of color filters used in a conventional imaging photodetection device.

Figure 19:
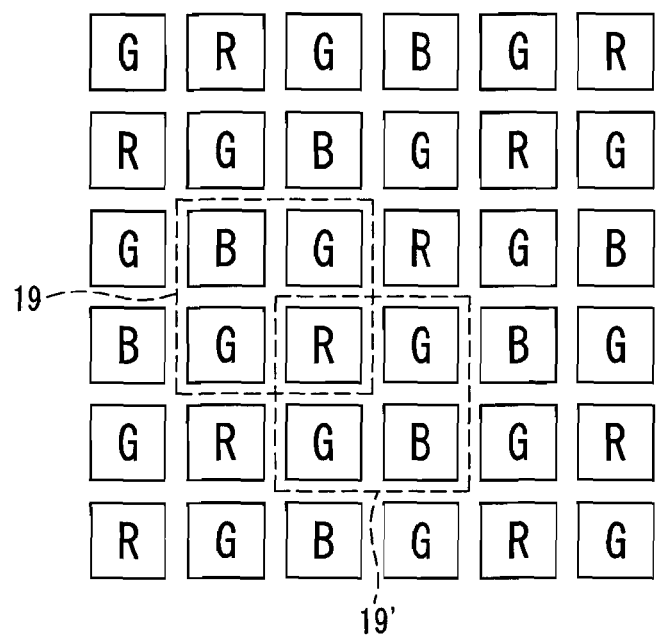

FIG. 19 is a view showing an example of an arrangement of photodetectors in a conventional imaging photodetection device.

Figure 20:
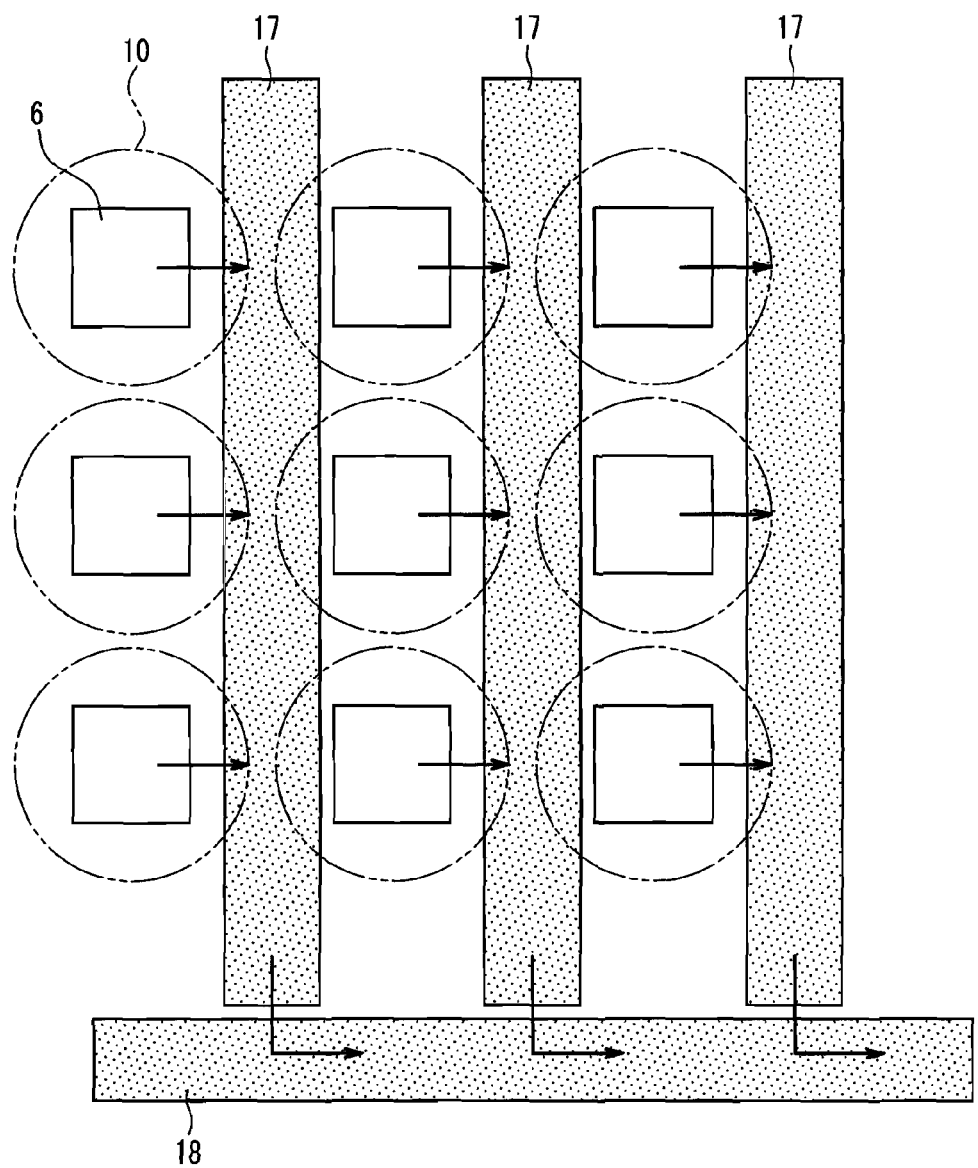

FIG. 20 is a magnified plan view of a photodetection plane, showing a planar arrangement of constituent elements of a conventional imaging photodetection device.

Figure 21:
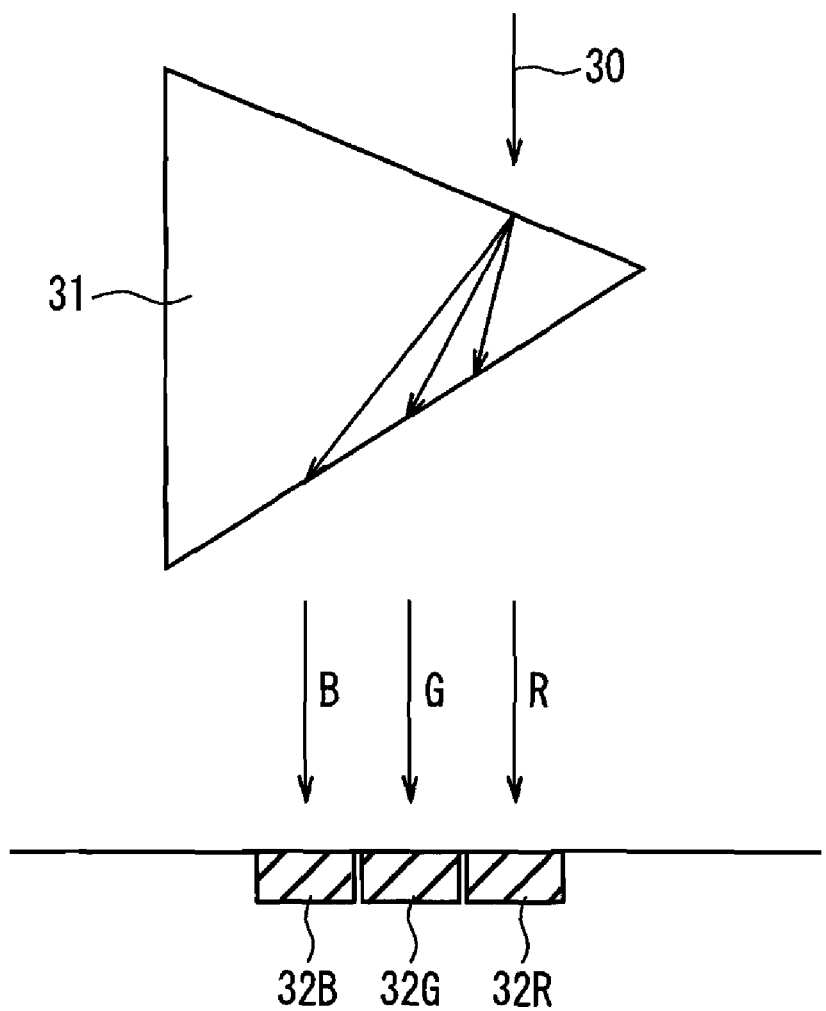

FIG. 21 is a view showing the principles of a conventional imaging photodetection device that carries out color separation by using a microprism.

DESCRIPTION OF THE INVENTION

In the imaging photodetection device of the present invention, it is preferable that, on the cross-section of the transparent high refractive index sections, a width of the transparent high refractive index sections changes between before and after a bent portion of the central axis, and a width of the transparent high refractive index sections on a side closer to the substrate than the bent portion of the central axis is smaller than a width of the transparent high refractive index sections on an opposite side thereto. Accordingly, light can be separated more effectively. Here, it is preferable that "width of the transparent high refractive index sections" is construed as referring to a width of the transparent high refractive index sections near a bent portion of the central axis.

It is preferable that the $0^{th}$-order diffracted light is detected by a first photodetector, the $1^{st}$-order diffracted light is detected by a second photodetector, and the $-1^{st}$-order diffracted light is detected by a third photodetector. Thereby, it is possible to detect light beams of different wavelengths respectively with different photodetectors.

In the description above, it is preferable that, in the case where light that enters the transparent low refractive index layer and the transparent high refractive index section is white light, light that enters the first photodetector has a light amount peak in a green wavelength region of 0.50 µm to 0.60 µm, light that enters the second photodetector has a light amount peak in a red wavelength region of more than 0.60 µm, and light that enters the third photodetector has a light amount peak in a blue wavelength region of less than 0.50 µm. Accordingly, three primary colors can be detected.

In this case, it is preferable that the first photodetector detects light in a deep layer region that does not include a surface thereof, the second photodetector detects light in a deep layer region that does not include a surface thereof, and the third photodetector detects light in a surface layer region that includes a surface thereof. Accordingly, color mixture can be suppressed, and the spectral performance can be improved.

Alternatively, the $0^{th}$-order diffracted light and the $1^{st}$-order diffracted light may be detected by the first photodetector, and the $-1^{st}$-order diffracted light may be detected by the second photodetector. Accordingly, one primary color and a complementary color thereof can be detected.

In the description above, it is preferable that, in the case where light that enters the transparent low refractive index layer and the transparent high refractive index section is white light, light that enters the first photodetector has a light amount peak in a wavelength region other than a blue wavelength region of at least 0.50 µm, and light that enters the second photodetector has a light amount peak in a blue wavelength region of less than 0.50 µm. Accordingly, blue and yellow, which is a complementary color thereof, can be detected.

In this case, it is preferable that the first photodetector detects light in a deep layer region that does not include a surface thereof, and the second photodetector detects light in a surface layer region that includes a surface thereof. Accordingly, color mixture can be suppressed, and the spectral performance can be improved.

Alternatively, the $1^{st}$-order diffracted light may be detected by a first photodetector, and the $0^{th}$-order diffracted light and the $-1^{st}$-order diffracted light may be detected by a second photodetector. Accordingly, one primary color and a complementary color thereof can be detected.

In the description above, it is preferable that, in the case where light that enters the transparent low refractive index layer and the transparent high refractive index section is white light, light that enters the first photodetector has a light amount peak in a red wavelength region of more than 0.60 µm, and light that enters the second photodetector has a light amount peak in a wavelength region other than a red wavelength region of not greater than 0.60 µm. Accordingly, red and cyan, which is a complementary color thereof, can be detected.

In this case, it is preferable that the first photodetector detects light in a deep layer region that does not include a surface thereof, and the second photodetector detects light in a surface layer region that includes a surface thereof. Accordingly, color mixture can be suppressed, and the spectral performance can be improved.

In the imaging photodetection device of the present invention, the central axes of the plurality of transparent high refractive index sections arranged along the first direction may be bent in the alternately opposite orientation. In this case, it is preferable that three photodetectors adjacent to each other in the first direction correspond to each of the plurality of transparent high refractive index sections, and two photodetectors on both outer sides of the three photodetectors arranged along the first direction correspond also to transparent high refractive index sections adjacent in the first direction to the transparent high refractive index section that corresponds to the three photodetectors. Accordingly, one transparent high refractive index section can separate light into three types of light, and, thus, a high resolution can be obtained.

In the description above, the transparent high refractive index sections may be arranged along a plurality of rows parallel to the first direction. In this case, it is preferable that a position in the first direction of each of the transparent high refractive index sections forming the rows of the transparent high refractive index sections parallel to the first direction is shifted between two rows adjacent to each other in a second direction, which is orthogonal to the first direction, by 0 units, 0.5 units, 1 unit, or 1.5 units of an arrangement pitch in the first direction. Accordingly, this configuration can be used in various pixel arrays.

Alternatively, in the imaging photodetection device of the present invention, the central axes of the plurality of transparent high refractive index sections arranged along the first direction may be bent in the same orientation. In this case, it is preferable that three photodetectors adjacent to each other in the first direction correspond to each of the plurality of transparent high refractive index sections, and each of the plurality of photodetectors detects any one of the $0^{th}$-order diffracted light, the $1^{st}$-order diffracted light, and the $-1^{st}$-order diffracted light. Accordingly, one transparent high refractive index section can separate light into three types of light, and, thus, a high resolution can be obtained.

In the description above, the transparent high refractive index sections may be arranged along a plurality of rows parallel to the first direction.

In this case, it is preferable that the central axes in rows of the transparent high refractive index sections parallel to the first direction are bent in the same orientation in two rows adjacent to each other in a second direction, which is orthogonal to the first direction, and a position in the first direction of each of the transparent high refractive index sections forming the rows of the transparent high refractive index sections parallel to the first direction is shifted between two rows adjacent to each other in the second direction by 0 units, ⅓ units, or ⅔ units of an arrangement pitch in the first direction. Accordingly, this configuration can be used in various pixel arrays.

Alternatively, it is preferable that the central axes in rows of the transparent high refractive index sections parallel to the first direction are bent in the opposite orientation in two rows adjacent to each other in a second direction, which is orthogonal to the first direction, and a position in the first direction of each of the transparent high refractive index sections forming the rows of the transparent high refractive index sections parallel to the first direction is shifted between two rows adjacent to each other in the second direction by 0 units, ⅓ units, or ⅔ units of an arrangement pitch in the first direction. Accordingly, this configuration can be used in various pixel arrays.

Hereinafter, preferred embodiments of the present invention will be described with reference to attached drawings. In the drawings, constituent elements common to those of conventional examples are assigned the identical reference numerals. It will be appreciated that the following embodiments are by all means examples, and the present invention is not limited to these embodiments.

Figure 1:
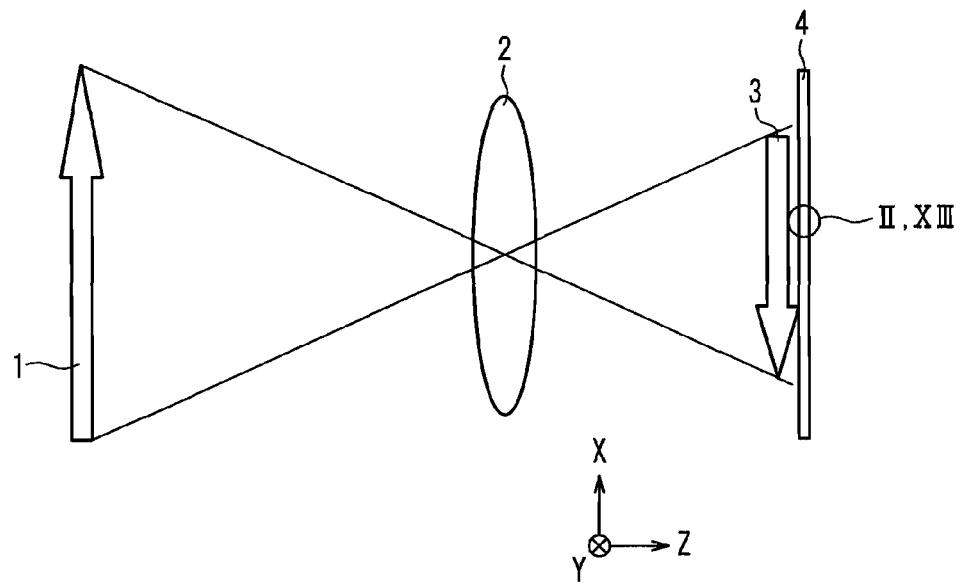
FIG. 1 is a side view showing a schematic configuration of an imaging device using an imaging photodetection device of the present invention.

FIG. 1 is a side view showing a schematic configuration of an imaging device using a photodetection device of the present invention. A light beam such as natural light enters an object 1, and the light beam reflected thereby forms an image 3 on a photodetection device 4 such as a CCD or a CMOS by a lens system 2. Though the lens system 2 is composed typically by combining a plurality of lenses aligned along an optical axis in order to ensure the optical performance, the lens system 2 is shown as a single lens schematically in FIG. 1. For convenience of the explanation below, an XYZ rectangular coordinate system is set, where the Z axis is a normal axis of a photodetection plane of the photodetection device 4 (or the surface of a below-mentioned substrate 5), the X axis is a vertical axis parallel to the photodetection plane, and the Y axis is a horizontal axis parallel to the photodetection plane.

Embodiment 1

Figure 2:
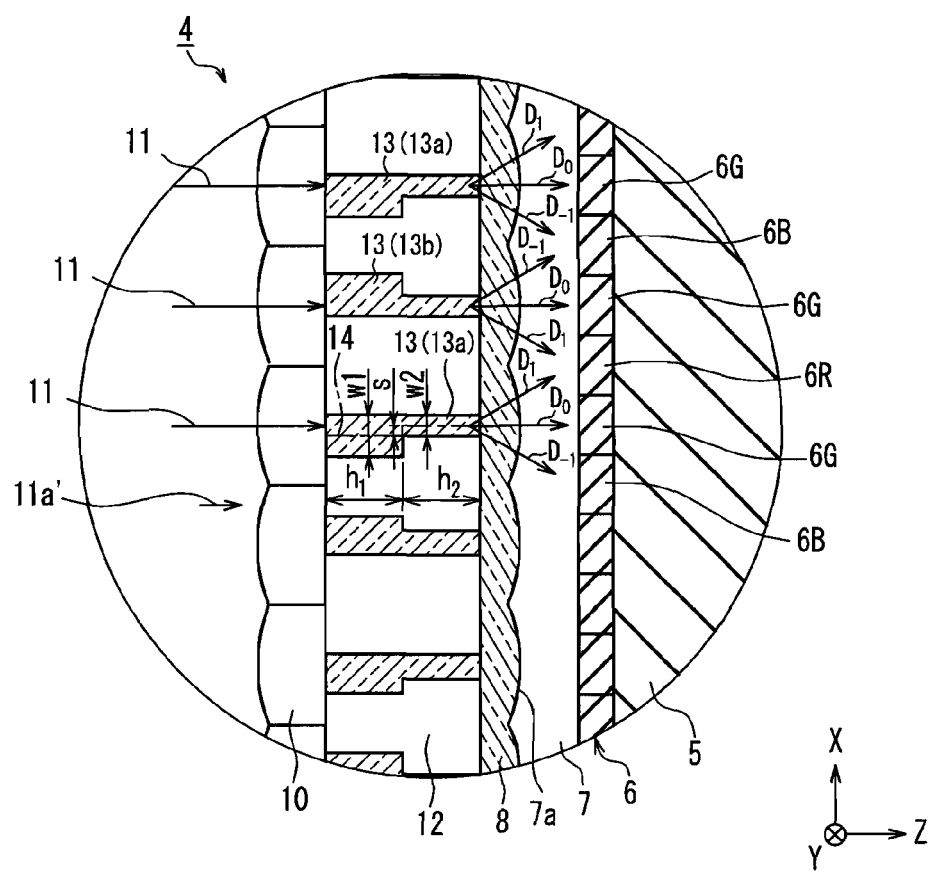
FIG. 2 is a magnified cross-sectional view of a portion II in FIG. 1, showing a schematic configuration of the imaging photodetection device according to Embodiment 1 of the present invention.

FIG. 2 is a magnified cross-sectional view of a portion II in FIG. 1, showing a schematic configuration of the photodetection device 4 according to Embodiment 1 of the present invention. A transparent low refractive index buffer layer 7 made of $SiO_2$ or the like, a transparent high refractive index buffer layer 8 made of SiN or the like, a transparent low refractive index layer 12 made of $SiO_2$ or the like and a plurality of microlenses 10 are laminated in this order on a detection substrate 5 where a plurality of photodetectors 6 have been formed. In the transparent low refractive index layer 12, a plurality of transparent high refractive index sections 13 made of SiN or the like are embedded. An uneven structure is provided on a surface 7a of the transparent buffer layer 7 in contact with the transparent buffer 8 so that the thickness of the transparent buffer layer 7 is reduced on the central axis of each of the microlenses 10, and the same action as a lens is achieved (the uneven structure of the surface 7a is referred to as an internal microlens). In contrast, a surface 8a of the transparent buffer layer 8 in contact with the transparent low refractive index layer 12 is planar.

The microlenses 10 are arranged on the respective intersections of an orthogonal grid formed by a plurality of straight lines parallel to the X-axis direction and a plurality of straight lines parallel to the Y-axis direction. The transparent high refractive index sections 13 are in a one-to-one correspondence with the microlenses 10, and one transparent high refractive index section 13 is arranged on the central axis of each microlens 10. Similarly, the photodetectors 6 are arranged on the respective intersections of an orthogonal grid formed by a plurality of straight lines parallel to the X-axis direction and a plurality of straight lines parallel to the Y-axis direction. The central axes of the respective microlenses 10 adjacent to each other in the X-axis direction (vertical direction on the surface of FIG. 2) pass through substantially the centers of every other photodetector 6. The central axes of the respective microlenses 10 adjacent to each other in the Y-axis direction (direction perpendicular to the surface of FIG. 2) pass through substantially the centers of the photodetectors 6 adjacent to each other (see FIG. 11 described below).

The microlenses 10 function so as to refract light such as a light beam $11a'$ that enters with a shift relative to the central axis of the microlens 10 and guide the light to transparent high refractive index sections 13. The uneven structure (internal microlens) on the surface 7a of the transparent buffer layer 7 also has a lens effect, thereby suppressing divergence of the respective diffracted lights $D_0$, $D_1$, and $D_{-1}$ that exit the transparent high refractive index sections 13 and guiding them still as small spots to the corresponding photodetectors 6. Furthermore, the transparent high refractive index sections 13 function as a waveguide. Therefore, when light inclined with respect to the central axes of the microlenses 10 enters, the transparent high refractive index sections 13 function so as to correct the propagation orientation of the light and guide the light to the photodetectors 6. In this specification, in the case where the photodetectors 6 have to be particularly specified according to the light that enters the photodetectors 6, any one of letters "R", "G", and "B" is added. In the case where the photodetectors 6 do not have to be specified, the added letters are omitted.

As shown in FIG. 2, on a cross-section along a plane (XZ plane) including the X axis and the Z axis of the transparent high refractive index sections 13, a line obtained by sequentially linking, in the Z-axis direction, central points in the X-axis direction of the transparent high refractive index section 13 is referred to as a "central axis" of the transparent high refractive index section 13. A central axis 14 of the transparent high refractive index section 13 is bent stepwise. In Embodiment 1, the dimension (width) in the X-axis direction of the transparent high refractive index section 13 is changed between before and after a bent portion of the central axis 14, and a width w1 before the bent portion (on the side of the microlenses 10) and a width w2 after the bent portion (on the side of the photodetectors 6) satisfy w1>w2. The lengths in the Z-axis direction of the portions having the widths w1 and w2 are sequentially h1 and h2. In Embodiment 1, both of the central axis 14 of the portion having the width w1 and the central axis 14 of the portion having the width w2 are parallel to the Z axis, and a difference s in level in the X-axis direction therebetween is s=(w1−w2)/2. Furthermore, in Embodiment 1, the transparent high refractive index sections 13 are sorted into two kinds depending on the orientation of the bent portion of the central axis 14. That is to say, on the surface of FIG. 2, the transparent high refractive index sections 13 include transparent high refractive index sections 13a in which the central axis 14 of the portion having the width w2 is positioned above the central axis 14 of the portion having the width w1 and transparent high refractive index sections 13b in which the central axis 14 of the portion having the width w2 is positioned below the central axis 14 of the portion having the width w1. In this specification, in the case where the transparent high refractive index sections 13 have to be particularly specified according to the difference in orientation of the bent portion of the central axis 14, the letter "a" or "b" is added. In the case where the transparent high refractive index sections 13 do not have to be specified, the added letters are omitted. In Embodiment 1, the central axes 14 of two transparent high refractive index sections 13 adjacent to each other in the X-axis direction are bent in the opposite orientation. That is to say, in the X-axis direction, the transparent high refractive index sections 13a and the transparent high refractive index sections 13b are alternately arranged.

The transparent high refractive index sections 13 are shaped as plates continuous in the Y-axis direction (direction perpendicular to the surface of FIG. 2) or as columns separated in a one-to-one correspondence with the positions of the microlenses 10 arranged in the Y-axis direction. When the transparent high refractive index sections 13 are columnar, the dimension thereof in the Y-axis direction is twice to triple or more the width of the thicker portion in the X-axis direction (the width w1 in Embodiment 1).

A light beam 11 that enters the transparent high refractive index section 13 is separated into $0^{th}$-order diffracted light $D_0$, $1^{st}$-order diffracted light $D_1$, and $-1^{st}$-order diffracted light $D_{-1}$ in the XZ plane at the time of exiting the transparent high refractive index section 13, and detected respectively by the photodetectors 6G, 6R, and 6B. Since the central axes 14 are bent in the opposite orientation in the transparent high refractive index section 13a and the transparent high refractive index section 13b, the exit directions of the $1^{st}$-order diffracted light $D_1$ and the $-1^{st}$-order diffracted light $D_{-1}$ with respect to the $0^{th}$-order diffracted light $D_0$ are opposite between the transparent high refractive index section 13a and the transparent high refractive index section 13b. In order to separate definitely the respective light distributions of the $0^{th}$-order diffracted light $D_0$, the $1^{st}$-order diffracted light $D_1$, and the $-1^{st}$-order diffracted light $D_{-1}$, it is preferable that a spacing of at least 1 μm is provided between the tips of the transparent high refractive index sections 13 and the photodetectors 6.

Figure 3:
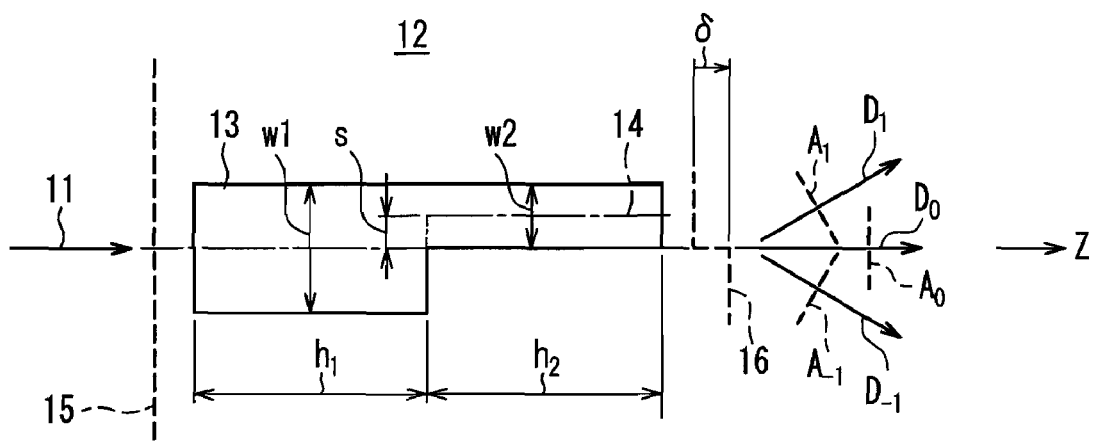
FIG. 3 is a view illustrating a principle in which diffracted light is generated by a transparent high refractive index section in the imaging photodetection device according to Embodiment 1 of the present invention.

FIG. 3 is a view illustrating the principle of how diffracted light is generated by the transparent high refractive index section 13 in the imaging photodetection device of Embodiment 1. The transparent high refractive index section 13 is shaped as a plate having widths (the dimensions in the X-axis direction) w1 and w2 and lengths (dimensions in the Z-axis direction) h1 and h2, and extending in a direction perpendicular to the surface of FIG. 3 (Y-axis direction). The difference in level of the bent portion of the central axis 14 is denoted by s (for the sake of simplicity, the case in which s =(w1 −w2)/2 is shown in FIG. 3). Here, 'n' denotes the refractive index of the transparent high refractive index sections 13, and '$n_o$' denotes the refractive index of the surrounding transparent low refractive index layer 12. Here, the wavefront of a light beam 11 that enters the transparent high refractive index section 13 through the microlens 10 is taken as a plane wave 15. As a result of the light beam 11 passing through the transparent high refractive index section 13 and the surrounding transparent low refractive index layer 12, a phase shift δ as expressed by the formula below occurs on the wavefront 16 of the outgoing light (in terms of length in vacuum).

$$\delta = h2(n - n_0) \quad \text{(Formula 1)}$$

Due to this phase shift, the outgoing light is diffracted and separated to form $0^{th}$-order diffracted light $D_0$, $1^{st}$-order diffracted light $D_1$ and $-1^{st}$-order diffracted light $D_{-1}$. When the wavelength of the light beam 11 is denoted by λ, an integer k with which $|\delta - k\lambda|$ is closest to zero is always present. In the case where $\delta - k\lambda = 0$ with respect to this integer k, the wavefront 16 of the outgoing light is the same as the plane wave $A_0$, most energy is distributed to the $0^{th}$-order diffracted light $D_0$. In the case where $\delta - k\lambda < 0$, the wavefront 16 of the outgoing light is substantially the same as the plane wave $A_1$, and most energy is distributed to the $1^{st}$-order diffracted light $D_1$. In the case where $\delta - k\lambda > 0$, the wavefront 16 of the outgoing light is substantially the same as the plane wave $A_{-1}$, and most energy is distributed to the −1st-order diffracted light $D_{-1}$.

For example, when δ is 1.1 μm, in the case of light of a green wavelength, $\delta - k\lambda = 0$ is satisfied if k=2 and λ=0.55 μm. However, when k is the same, in the case of light of a red wavelength, $\delta - k\lambda < 0$, and, in the case of light of a blue wavelength, $\delta - k\lambda > 0$. Accordingly, the white light beam 11 that enters the transparent high refractive index sections 13 is separated into the $0^{th}$-order diffracted light $D_0$ as green light, the $1^{st}$-order diffracted light $D_1$ as red light, and the $-1^{st}$-order diffracted light $D_{-1}$ as blue light, and output. Here, (Formula 1) does not include the dimensions w1 and h1, and the like, and, thus, the portion before the bent portion of the central axis 14 (on the side of the microlenses 10) seems to be unnecessary in the structure of the transparent high refractive index section 13, but this is not true. The description above is by all means a description according to geometrical optics, and the following description can be given according to wave optics.

Figure 4A:
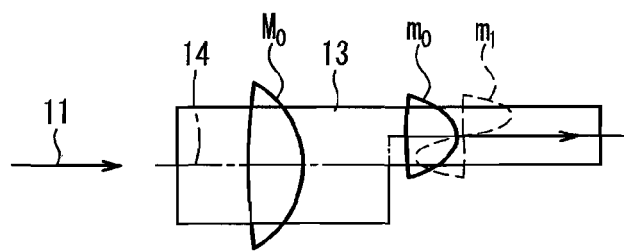
FIG. 4A is a view illustrating, according to wave optics, a principle in which diffracted light is generated by a transparent high refractive index section in the imaging photodetection device according to Embodiment 1 of the present invention.
Figure 4B:
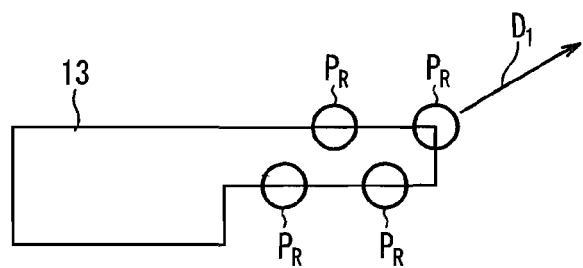
FIG. 4B is a view illustrating, according to wave optics, a principle in which light of a red wavelength is separated as $1^{st}$-order diffracted light by the transparent high refractive index section in FIG. 4A.
Figure 4C:
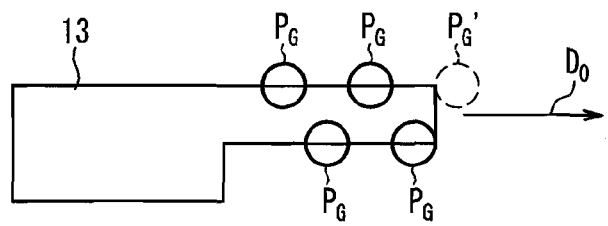
FIG. 4C is a view illustrating, according to wave optics, a principle in which light of a green wavelength is separated as $0^{th}$-order diffracted light by the transparent high refractive index section in FIG. 4A.
Figure 4D:
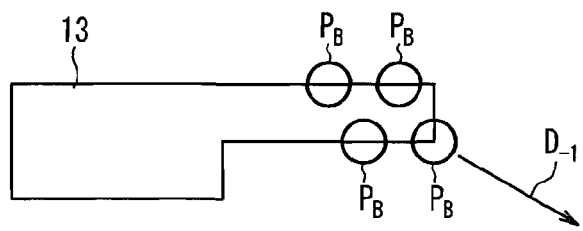
FIG. 4D is a view illustrating, according to wave optics, a principle in which light of a blue wavelength is separated as $-1^{st}$-order diffracted light by the transparent high refractive index section in FIG. 4A.

FIGS. 4A to 4D are views illustrating, according to wave optics, a principle of how diffracted light is generated by the transparent high refractive index section 13 in the imaging photodetection device of Embodiment 1. As shown in FIG. 4A, the light beam 11 that enters the transparent high refractive index section 13 via the microlens 10 excites $0^{th}$-order waveguide mode light beam $M_0$ that is transmitted inside the transparent high refractive index section 13. When the waveguide mode light beam $M_0$ passes through the bent portion of the central axis 14 of the transparent high refractive index section 13, the transmission mode is disturbed, and, in the transmission after the bent portion (on the side of the photodetectors 6), $0^{th}$-order waveguide mode light beam $m_0$, $1^{st}$-order waveguide mode light beam $m_1$, higher order waveguide mode light beams and radiation mode light beams, and the like are generated. In the $0^{th}$-order waveguide mode light beam $m_0$, the amplitude distribution of light is in a Gaussian form, but, in the $1^{st}$-order waveguide mode light beam $m_1$, the polarity of the amplitude is reversed near the central axis of the transmission path. Moreover, the equivalent refractive index of the $0^{th}$-order waveguide mode light beam $m_0$ is larger than that of the $1^{st}$-order waveguide mode light beam $m_1$, and, thus, when the $0^{th}$-order waveguide mode light beam $m_0$ and the $1^{st}$-order waveguide mode light beam $m_1$ are mixed in a balanced manner in the same waveguide, these light beams intricately interfere with each other in the transmission direction, and increase or reduce each other's intensity at a spacing proportional to the wavelength. Since the polarity of the amplitude of the $1^{st}$-order waveguide mode light beam $m_1$ is reversed near the central axis, light interference also is reversed at the central axis. As shown in FIG. 4B, for example, in the case of light of a red wavelength, two kinds of mode light beams increase each other's intensity at a plurality of points $P_R$. In the case where the last point $P_R$ is positioned at the exit end of the transparent high refractive index section 13, light is radiated from the central axis of the transmission path toward the last point $P_R$ as the $1^{st}$-order diffracted light $D_1$. As shown in FIG. 4D, in the case of light of a blue wavelength, two kinds of mode light beams increase each other's intensity at a plurality of points $P_B$. The spacing between the points $P_B$ is smaller than the spacing between the points $P_R$. In the case where the last point $P_B$ is positioned at the exit end of the transparent high refractive index section 13, light is radiated from the central axis of the transmission path toward the last point $P_B$ as the $-1^{st}$-order diffracted light $D_{-1}$. Conversely, as shown in FIG. 4C, in the case of light of a green wavelength, two kinds of mode light beams increase each other's intensity at a plurality of points $P_G$. The spacing between the points $P_G$ is smaller than the spacing between the points $P_R$ and larger than the spacing between the points $P_B$. In the case where the exit end of the transparent high refractive index section 13 is positioned between the last point $P_G$ and a subsequent virtual point $P_G'$, light is radiated in a direction along the central axis of the transmission path as the $0^{th}$-order diffracted light $D_0$. Accordingly, the white light beam 11 that enters the transparent high refractive index section 13 is separated into the $0^{th}$-order diffracted light $D_0$ as green light, the $1^{st}$-order diffracted light $D_1$ as red light, and the $-1^{st}$-order diffracted light $D_{-1}$ as blue light, and output. The description above is merely an example, and the $1^{st}$-order diffracted light $D_1$ may be blue light, and the $-1^{st}$-order diffracted light $D_{-1}$ may be red light, depending on the dimension of each portion of the transparent high refractive index section 13. The structure portion having the dimensions w1 and h1 and the bent structure of the central axis 14 having the difference s in level are essential in order to realize a state in which two kinds of mode light beams are mixed in a balanced manner in the structure portion having the dimensions w2 and h2, and this is clarified only in the description above according to wave optics. The width w1 has to be large to some extent in order to convert the incident light beam 11 into a waveguide mode. Furthermore, the width w2 is preferably small in order to reduce the possible order of waveguide mode generated after the bent portion (i.e., the total number of waveguide mode light beams). Accordingly, it is typically preferable that w1>w2 is satisfied, in order to realize a state in which two kinds of mode light beams are mixed in a balanced manner in the transparent high refractive index section 13 having the bent central axis 14.

Figure 5A:
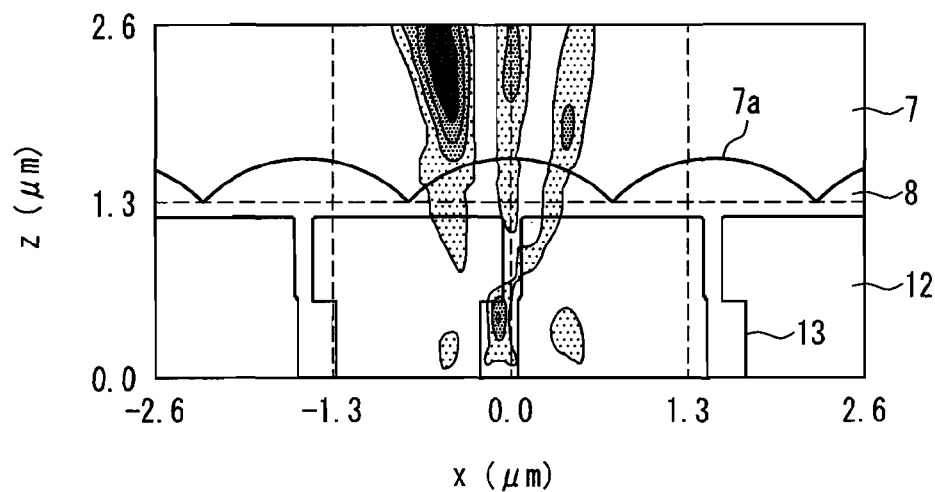
FIG. 5A is a diagram showing an intensity distribution of light of a blue wavelength transmitted through a transparent high refractive index section to a photodetector in the imaging photodetection device according to Embodiment 1 of the present invention.
Figure 5B:
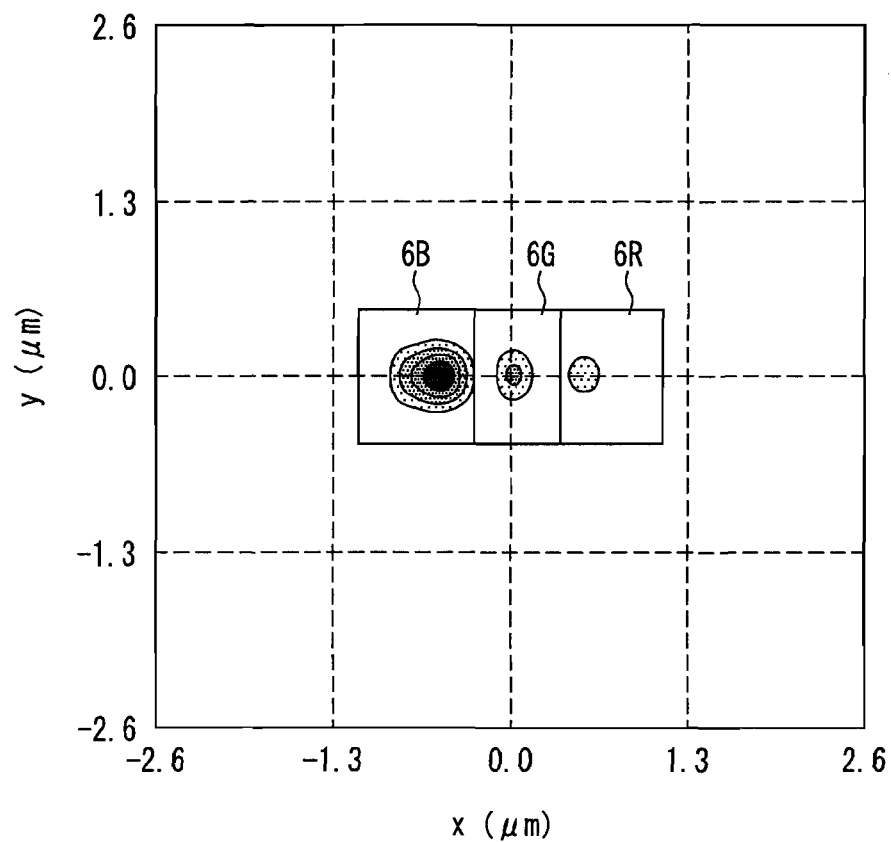
FIG. 5B is a diagram showing an intensity distribution of light of a blue wavelength projected through a transparent high refractive index section on a photodetector in the imaging photodetection device according to Embodiment 1 of the present invention.
Figure 6A:
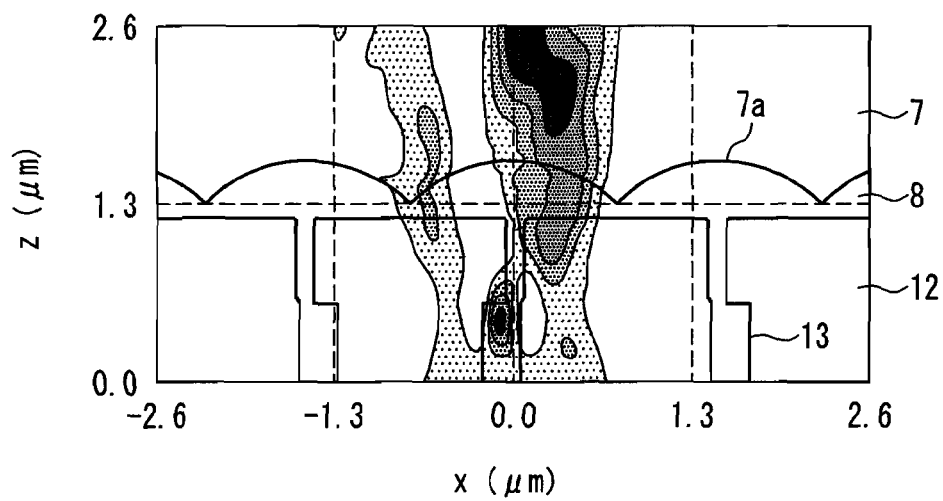
FIG. 6A is a diagram showing an intensity distribution of light of a green wavelength transmitted through a transparent high refractive index section to a photodetector in the imaging photodetection device according to Embodiment 1 of the present invention.
Figure 6B:
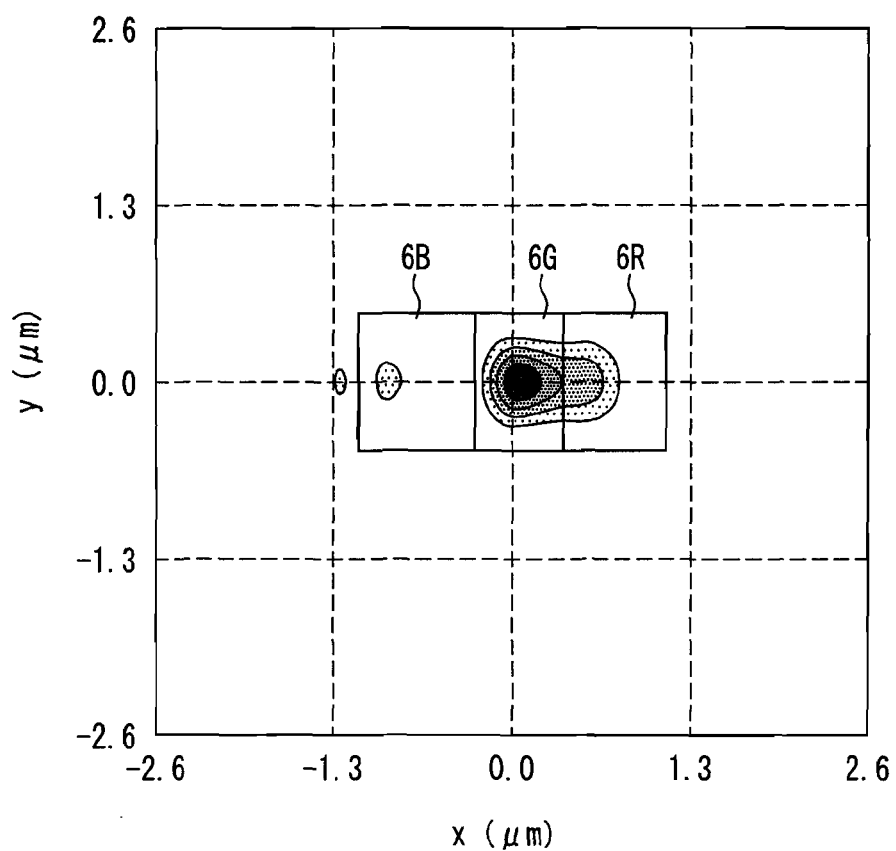
FIG. 6B is a diagram showing an intensity distribution of light of a green wavelength projected through a transparent high refractive index section on a photodetector in the imaging photodetection device according to Embodiment 1 of the present invention.
Figure 7A:
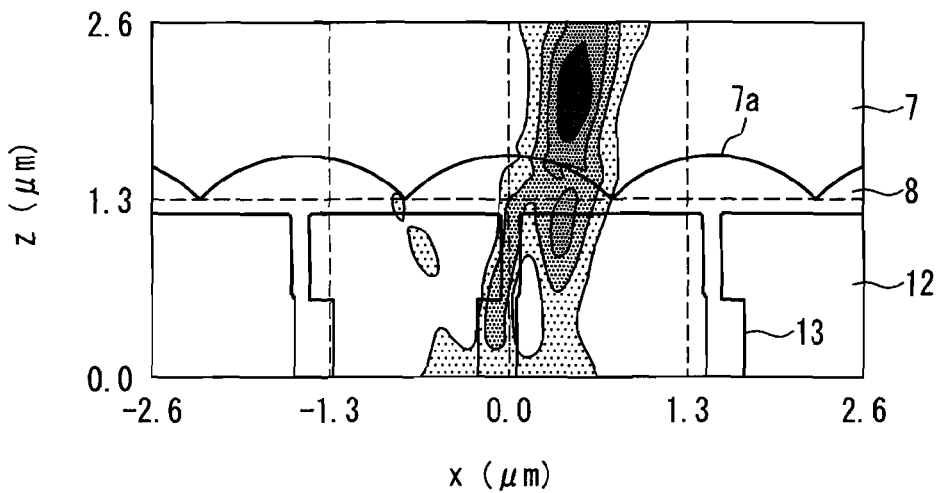
FIG. 7A is a diagram showing an intensity distribution of light of a red wavelength transmitted through a transparent high refractive index section to a photodetector in the imaging photodetection device according to Embodiment 1 of the present invention.
Figure 7B:
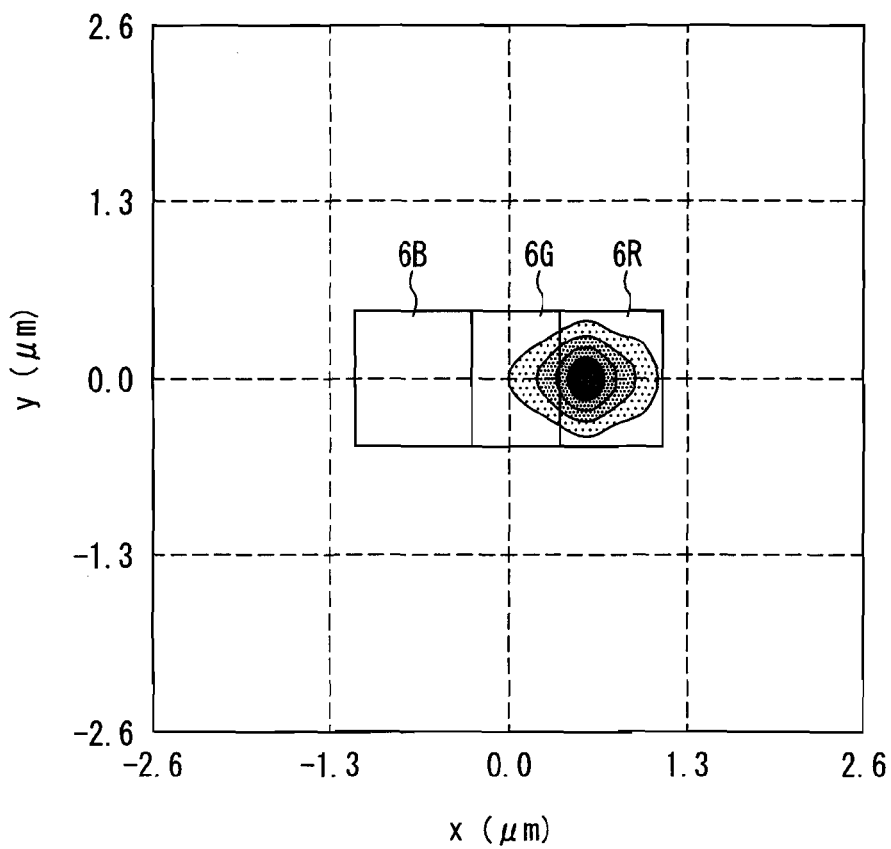
FIG. 7B is a diagram showing an intensity distribution of light of a red wavelength projected through a transparent high refractive index section on a photodetector in the imaging photodetection device according to Embodiment 1 of the present invention.

FIGS. 5A, 6A, and 7A show intensity distributions (calculation results based on wave optics) in the XZ cross-section of light having wavelengths of 0.45 μm, 0.55 μm, and 0.65 μm transmitted through the transparent high refractive index section 13 toward the photodetector in the imaging photodetection device of Embodiment 1. FIGS. 5B, 6B, and 7B are views showing intensity distributions (calculation results based on wave optics) in the XY cross-section of light projected on a photodetection plane of a photodetector. The calculations were performed under the following conditions. The microlens 10 was omitted, and white light having a uniform intensity was caused to enter, along the Z-axis direction, a square region having a size of 1.5 μm×1.5 μm centered about the origin in the XY coordinates. The dimensions of the transparent high refractive index sections 13 were set such that the width w1=0.30 μm, w2=0.15 μm, and length h1=h2=0.60 μm, and the difference s in level of the bent portion of the central axes 14 was set to 0.10 μm. The transparent high refractive index sections 13 were arranged such that the structure portions having the dimensions w2 and h2 were aligned in the X-axis direction at a pitch of 1.5 μm, and were arranged continuously in the Y-axis direction. Furthermore, the internal microlenses 7a were aligned both in the X-axis direction and in the Y-axis direction at a pitch of 1.5 μm, and the distance from the tip of the internal microlens 7a to the surface of the photodetectors 6 was set to 1.0 μm. Here, the transparent high refractive index sections 13 and the transparent high refractive index buffer layer 8 were assumed to be made of SiN, the refractive indexes thereof were set to 2.04, and the Abbe's numbers thereof were set to 20. The transparent low refractive index buffer layer 7 and the transparent low refractive index layers 12 were assumed to be made of $SiO_2$, the refractive indexes thereof were set to 1.456, and the Abbe's numbers thereof were set to 65. The photodetectors 6R, 6G, and 6B were adjacent to each other in this order, and the sizes in the X-axis direction×the Y-axis direction were subsequently set to 0.75 μm×1.0 μm, 0.65 μm×1.0 μm, and 0.85 μm×1.0 μm (the line separating the photodetectors 6G and 6B was shifted in a positive orientation of the X axis by 0.10 μm from the state of equal division). FIGS. 5B, 6B, and 7B show only three photodetectors 6R, 6G, and 6B, but these photodetectors were actually aligned in this order in the X-axis direction without a spacing interposed therebetween, and aligned in the Y-axis direction at a pitch of 1.5 μm (i.e., with a spacing of 0.5 μm interposed therebetween). The spacings arranged in the Y-axis direction are used for a CCD transfer path, wires, or the like. As seen from FIGS. 5B, 6B, and 7B, the transparent high refractive index sections 13 of Embodiment 1 separate light into red light, green light, and blue light, and these lights are detected by the respectively different photodetectors 6R, 6G, and 6B.

Figure 8A:
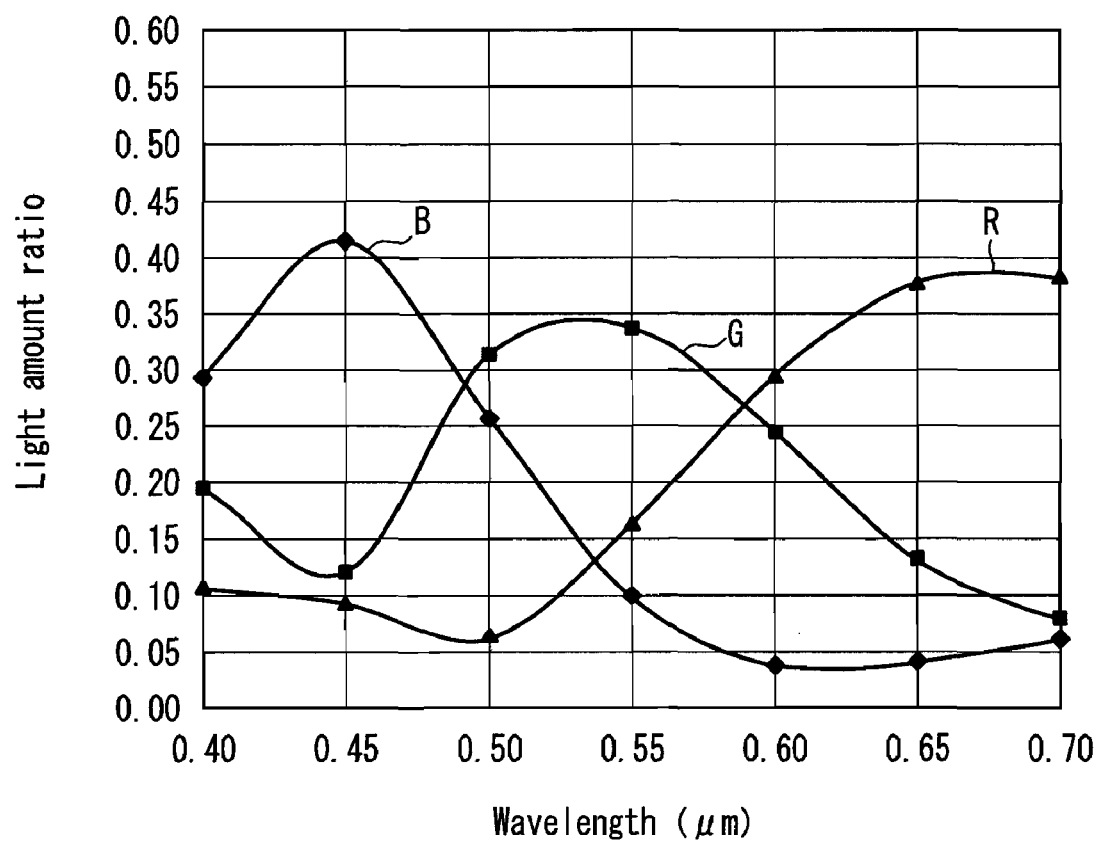
FIG. 8A is a graph showing the spectral characteristics of the amount of light detected by photodetectors 6R, 6G, and 6B.

FIG. 8A is a graph showing spectral characteristics in which the amount of light detected by the photodetectors 6R, 6G, and 6B independent of each other on the photodetection plane is plotted taking the wavelength on the horizontal axis. The light amount ratio on the vertical axis refers to the amount of light detected by each photodetector normalized taking the amount of incident light as 1. The curves R, G, and B respectively refer to light amount distribution curves detected by the photodetectors 6R, 6G, and 6B. The light amount distribution curve G of light that enters the photodetector 6G has a light amount peak in a green wavelength region of 0.50 μm to 0.60 μm, the light amount distribution curve R of light that enters the photodetector 6R has a light amount peak in a red wavelength region of more than 0.60 μm, and the light amount distribution curve B of light that enters the photodetector 6B has a light amount peak in a blue wavelength region of less than 0.50 μm. The characteristics shown in FIG. 8A correspond to the spectral sensitivity characteristics of color filters in the conventional photodetection device shown in FIG. 18, and show a good spectral performance in spite of the conditions for a high resolution that the arrangement pitch in the X-axis direction of the photodetectors is 0.75 μm. Here, the total of the curves R, G, and B is smaller than the amount of incident light by 20 to 30%. However, part of the portion reduced is a reflection component, and another part of the portion reduced is a component that leaks out of the photodetectors 6R, 6G, and 6B. The latter portion becomes stray light and is detected by a photodetector in another region, and, thus, the actual spectral characteristics are slightly lower than those in FIG. 8A.

Figure 8B:
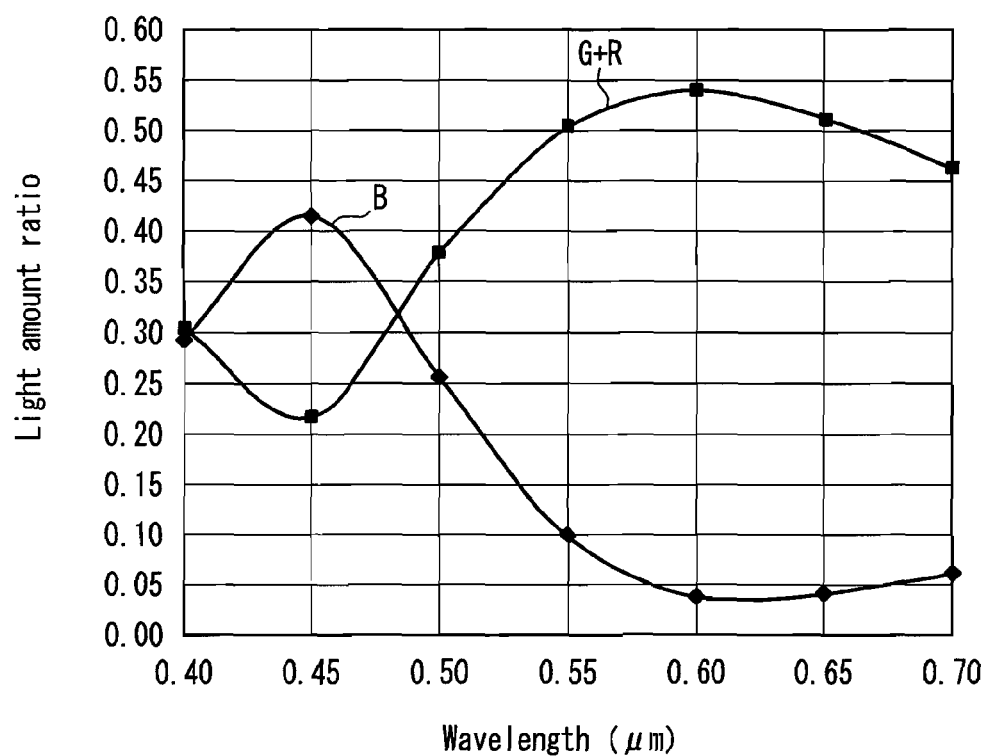
FIG. 8B is a graph showing the spectral characteristics in the case where the photodetectors 6G and 6R are combined.
Figure 8C:
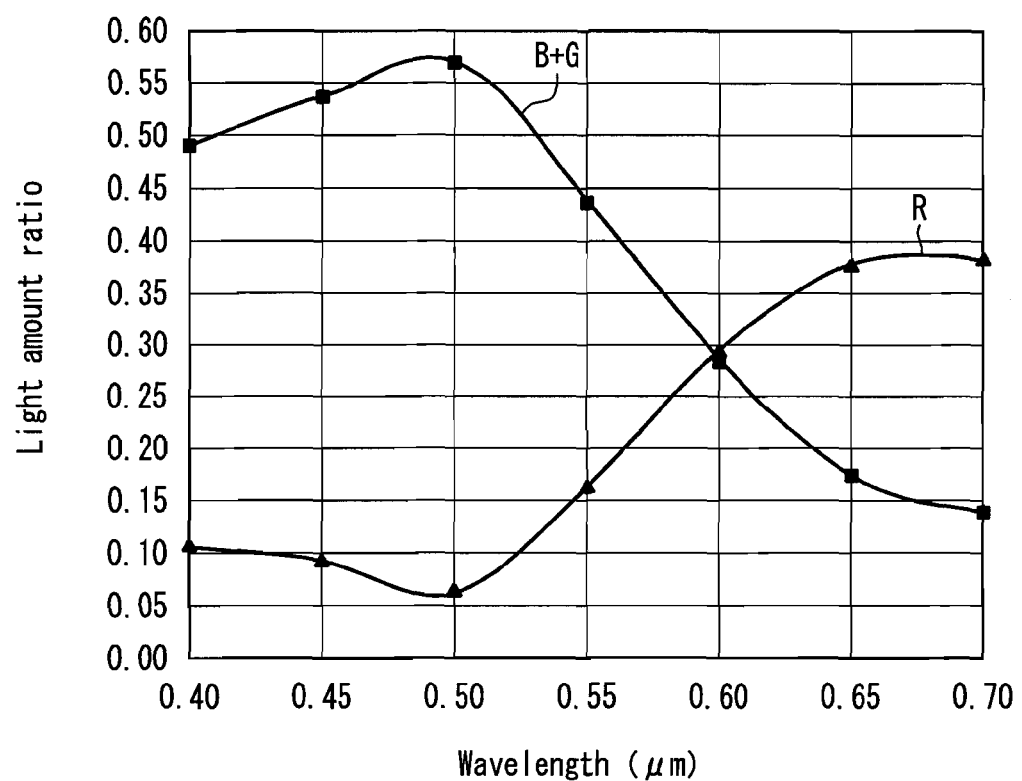
FIG. 8C is a graph showing the spectral characteristics in the case where the photodetectors 6B and 6G are combined.

FIGS. 8B and 8C are graphs showing spectral characteristics plotted as in FIG. 8A, wherein FIG. 8B shows the case where the photodetectors 6G and 6R are combined, and FIG. 8C shows the case where the photodetectors 6B and 6G are combined. In FIG. 8B, a curve G+R shows a light amount distribution curve detected by a combined photodetector in which the photodetectors 6G and 6R are combined. In FIG. 8C, a curve B+G shows a light amount distribution curve detected by a combined photodetector in which the photodetectors 6B and 6G are combined. As shown in FIG. 8B, in the case where the photodetectors 6G and 6R are combined, the light amount distribution curve G+R of light that enters the combined photodetector has a light amount peak in a wavelength region other than a blue wavelength region of at least 0.50 μm, and the light amount distribution curve B of light that enters the photodetector 6B has a light amount peak in a blue wavelength region of less than 0.50 μm. Accordingly, blue and yellow, which is a complementary color of blue, can be detected. As shown in FIG. 8C, in the case where the photodetectors 6B and 6G are combined, the light amount distribution curve R of light that enters the photodetector 6R has a light amount peak in a red wavelength region of more than 0.60 μm, and the light amount distribution curve B+G of light that enters the combined photodetector has a light amount peak in a wavelength region other than a red wavelength region of not greater than 0.60 μm. Accordingly, red and cyan, which is a complementary color of red, can be detected. In this manner, in the case where photodetectors are combined such that the $0^{th}$-order diffracted light and the $1^{st}$-order diffracted light or the $-1^{st}$-order diffracted light are detected by the same photodetector, a primary color and a complementary color thereof can be detected.

Figure 9:
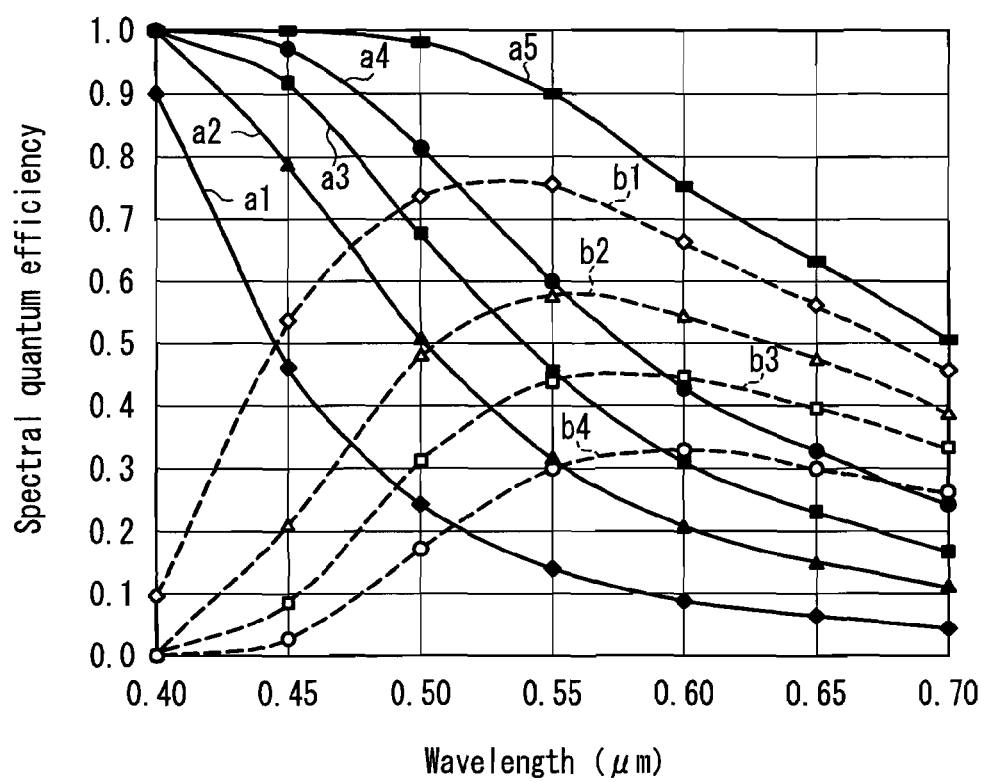
FIG. 9 is a graph showing the spectral quantum efficiency of photodetectors in which depth conditions from a surface are used as parameters.

FIG. 9 shows the wavelength dependence (spectral quantum efficiency) of the quantum efficiency of the photodetectors obtained based on the dispersion of Si complex refractive indexes, and the parameters refer to a range at a depth d μm from a surface. The spectral quantum efficiency refers to a normalized number of electrons generated through the photoelectric effect by irradiation with a given amount of light of a certain wavelength. The amount of current generated in the photodetector is obtained by multiplying the spectral quantum characteristics by the spectral characteristics of the light amounts as in FIGS. 8A to 8C. The curve a1 shows the spectral quantum efficiency in the case where d=0.0 to 0.2 μm, the curve a2 in the case where d=0.0 to 0.5 μm, the curve a3 in the case where d=0.0 to 0.8 μm, the curve a4 in the case where d=0.0 to 1.2 μm, the curve a5 in the case where d=0.0 to 3.0 μm, the curve b1 in the case where d=0.2 to 3.0 μm, the curve b2 in the case where d=0.5 to 3.0 µm, the curve b3 in the case where d=0.8 to 3.0 µm, and the curve b4 in the case where d=1.2 to 3.0 µm. It is seen that light of a short wavelength tends to be absorbed at a surface layer, and light of a longer wavelength is absorbed in a deeper layer.

Figure 10A:
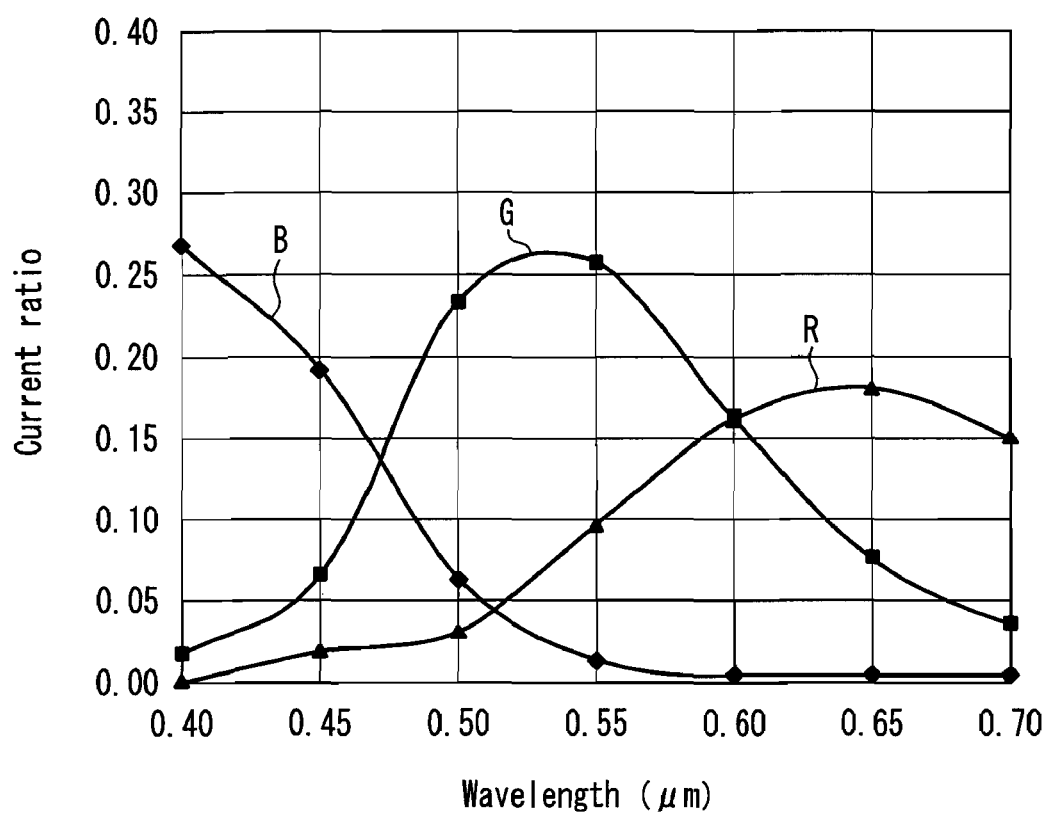
FIG. 10A is a graph showing the spectral characteristics of the amount of current generated in the photodetectors 6R, 6G, and 6B to which the effect of the spectral quantum efficiency of the photodetectors is added.
Figure 10B:
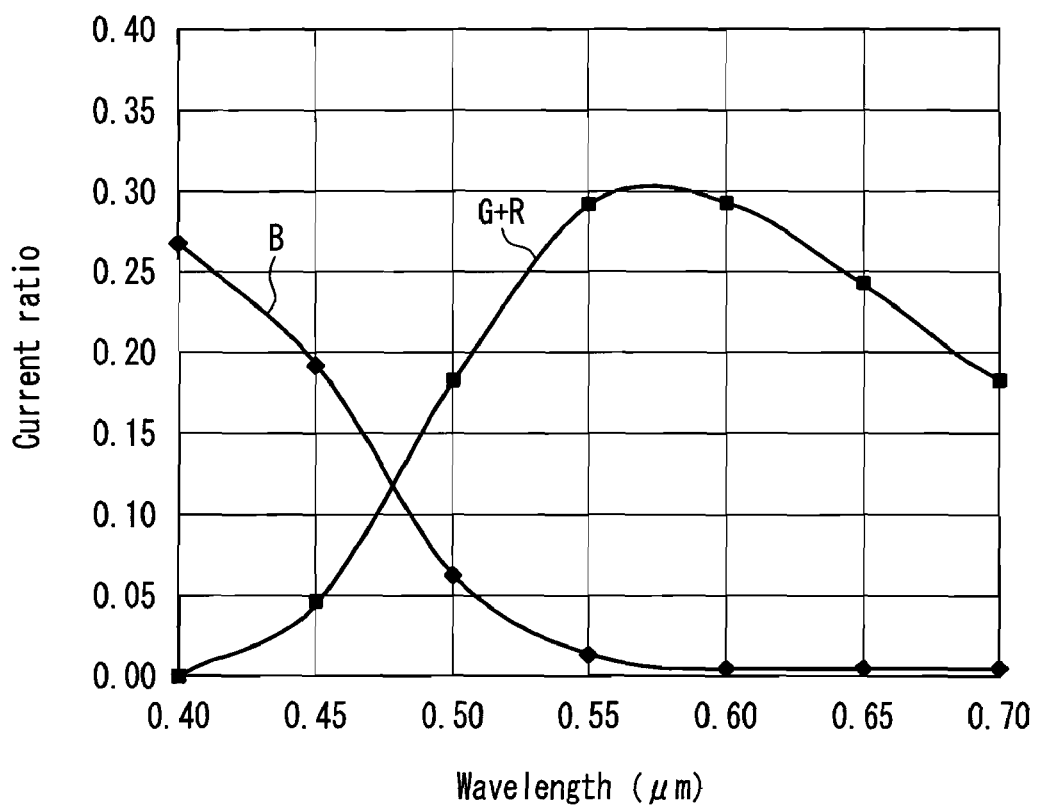
FIG. 10B is a graph showing the spectral characteristics of the amount of current to which the effect of spectral quantum efficiency of the photodetectors is added in the case where the photodetectors 6G and 6R are combined.
Figure 10C:
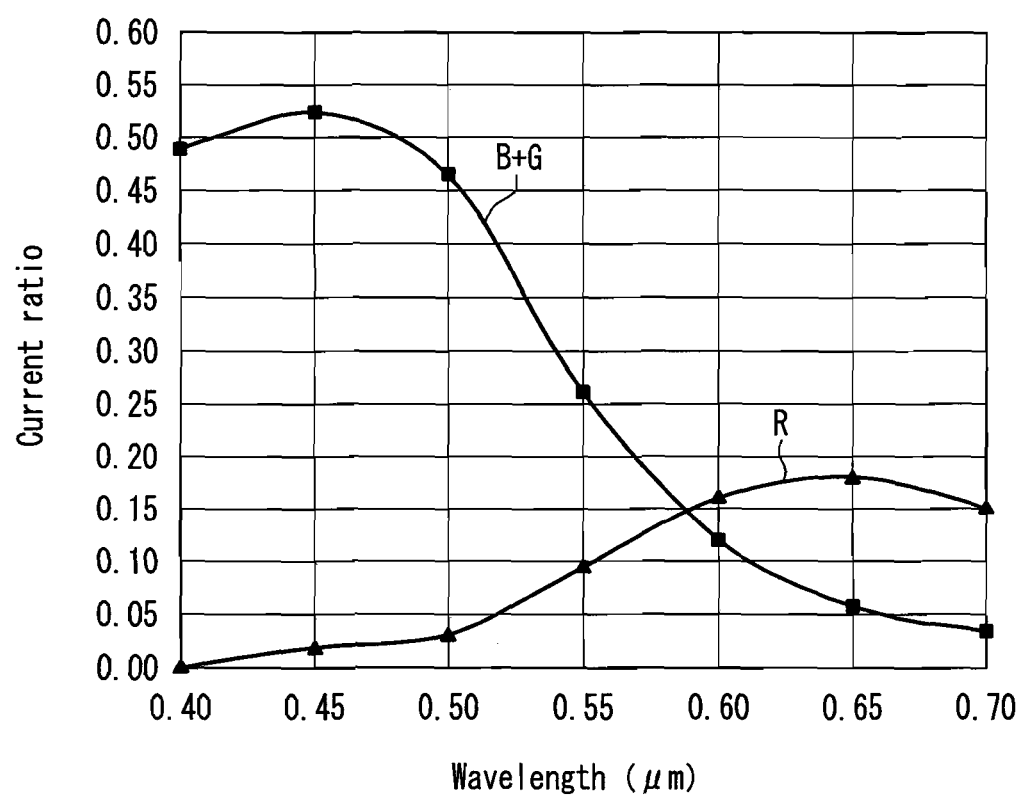
FIG. 10C is a graph showing the spectral characteristics of the amount of current to which the effect of spectral quantum efficiency of the photodetectors is added in the case where the photodetectors 6B and 6G are combined.

It is technically possible to select freely a depth of a region in a photodetector at which sensitivity is provided. When this technique is introduced to the spectral characteristics shown in FIGS. 8A, 8B, and 8C, the following results are obtained. FIG. 10A is a graph showing the spectral characteristics shown in FIG. 8A, but with the light detection regions of the photodetectors designed such that d=0.5 to 3.0 µm for the photodetector 6R, d=0.0 to 0.2 µm for the photodetector 6B, and d=0.2 to 3.0 µm for the photodetector 6G. FIG. 10B is a graph showing the spectral characteristics shown in FIG. 8B, but with the light detection regions of the photodetectors designed such that d=0.5 to 3.0 µm for a combined photodetector in which the photodetectors 6G and 6R are combined, and d=0.0 to 0.2 µm for the photodetector 6B. FIG. 10C is a graph showing the spectral characteristics shown in FIG. 8C, but with the light detection regions of the photodetectors designed such that d=0.5 to 3.0 µm for the photodetector 6R, and d=0.0 to 1.2 µm for a combined photodetector in which the photodetectors 6G and 6B are combined. In FIG. 10A, spectral characteristics of red, green, and blue with less color mixture than that in FIG. 8A are obtained. In FIG. 10B, spectral characteristics of blue and yellow with less color mixture than that in FIG. 8B are obtained. In FIG. 10C, spectral characteristics of red and cyan with less color mixture than that in FIG. 8C are obtained. It is seen that the spectral performance can be close to ideal when the characteristics of the spectral quantum efficiency of photodetectors are combined with Embodiment 1 in this manner.

Figure 11:
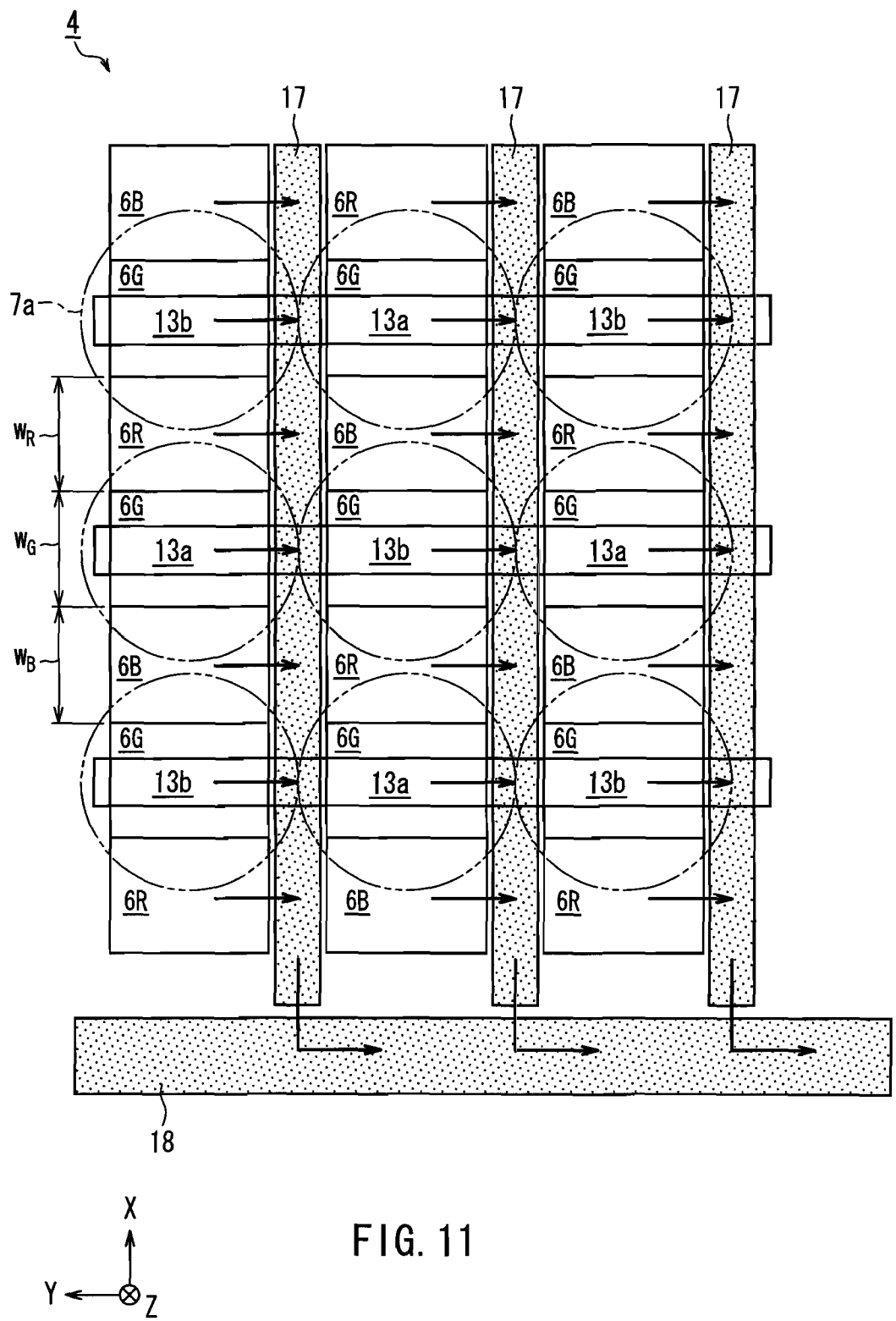
FIG. 11 is a magnified plan view of a photodetection plane, showing a planar arrangement of constituent elements of the imaging photodetection device according to Embodiment 1 of the present invention.

FIG. 11 is a magnified plan view showing constituent elements including the photodetection plane of the imaging photodetection device of Embodiment 1. A plurality of vertical transfer CCDs 17 as signal wires extending in the X-axis direction are provided between the photodetectors 6 adjacent to each other in the Y-axis direction. The plurality of vertical transfer CCDs 17 are connected to a horizontal transfer CCD 18 as a signal wire extending in the Y-axis direction.

White light that enters the imaging photodetection device passes through the transparent high refractive index sections 13a and 13b and diffracted to be separated on the XZ plane according to the wavelength, and received by the photodetectors 6R, 6G, and 6B so as to be converted photoelectrically. The electric charge stored in the respective photodetectors is sent to the vertical transfer CCDs 17, and further sent to the horizontal transfer CCD 18 so as to be output as image signals.

The transparent high refractive index sections 13a and 13b are arranged alternately in the X-axis direction. The rows of the transparent high refractive index sections arranged along the X-axis direction in this manner are arranged sequentially in the Y-axis direction while being shifted in the X-axis direction by one unit of the arrangement pitch in the X-axis direction of the transparent high refractive index sections (more specifically, the arrangement pitch in the X-axis direction of the portions of the transparent high refractive index sections having the width w2, that is, the arrangement pitch in the X-axis direction of the internal microlenses 7a). As a result, the transparent high refractive index sections 13a and 13b are arranged alternately also in the Y-axis direction.

The photodetectors 6G respectively are arranged directly below the transparent high refractive index sections 13a and 13b (i.e., on the central axes of the internal microlenses 7a). Furthermore, photodetectors 6R and 6B are arranged alternately between photodetectors 6G adjacent to each other in the X-axis direction. That is to say, in the X-axis direction, the photodetectors 6R, 6G, 6B, and 6G are aligned in this order, and this sequence is repeated. The rows of the photodetectors arranged along the X-axis direction in this manner are arranged sequentially in the Y-axis direction while being shifted in the X-axis direction by one unit of the arrangement pitch in the X-axis direction of the transparent high refractive index sections. The widths of the photodetectors 6R, 6G, and 6B (the dimensions in the X-axis direction) $W_R$, $W_G$, $W_B$ may be the same or may be different from each other. In the examples in FIGS. 5B, 6B, and 7B, $W_R$ =0.75 µm, $W_G$ =0.65 µm, $W_B$ =0.85 µm, and the center in the X-axis direction of the array including the photodetectors 6R, 6G, and 6B in the X-axis direction matches the central axis 14 of the portion of the transparent high refractive index sections 13 having the width w2.

Figure 12A:
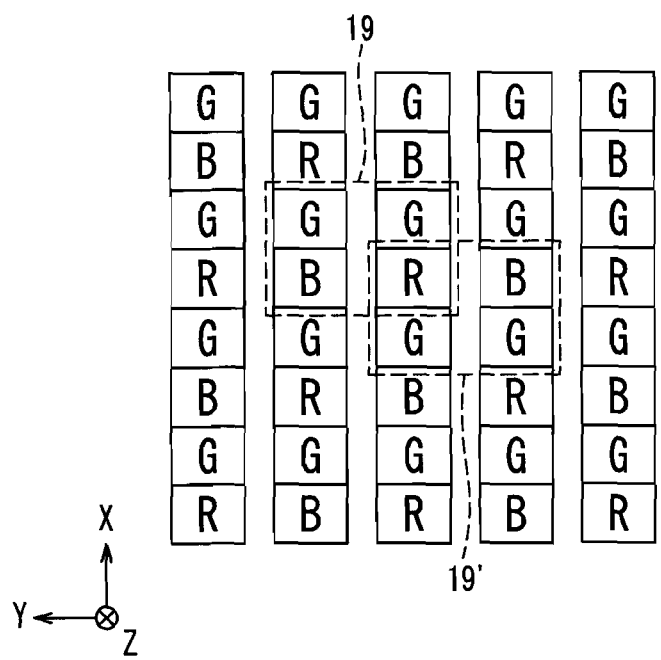
FIG. 12A is a view showing an example of an arrangement of photodetectors in the imaging photodetection device according to Embodiment 1 of the present invention.

FIG. 12A shows the arrangement of the photodetectors 6R, 6G, and 6B in the photodetection device 4 shown in FIG. 11. For the sake of simplicity of the drawing, the reference numeral "6" is omitted, and only R, G, and B added after "6" are shown. One color pixel 19 is configured with four basic pixels forming 2 columns×2 rows including two green pixels (basic pixels G), one blue pixel (basic pixel B), and one red pixel (basic pixel R). In contrast to the Bayer array in the conventional photodetection device shown in FIG. 19, in the array in FIG. 12A., two green pixels G are adjacent to each other in the Y-axis direction in the color pixel 19. However, as in the case of the Bayer array, a color pixel 19' can be formed also at a position obtained by shifting in the X-axis direction or the Y-axis direction by half the size of the color pixel 19 (the size of a basic pixel). Accordingly, the resolution can be improved to half the size of the color pixel 19 (¼ the area of the color pixel 19), that is, the size of a basic pixel, as in the Bayer array in FIG. 19.

As described above, in the conventional imaging photodetection device as shown in FIG. 17B, the color separation of light is carried out by the color filters 9 that absorb selectively two of three colors of red, green and blue. Therefore, 70 to 80% of light is absorbed by the color filters 9. In contrast, in the imaging photodetection device of Embodiment 1, the color separation of light is carried out by using not light absorption but light diffraction, and, thus, all the light can be utilized. As a result, in Embodiment 1, the efficiency of light utilization is improved two to three times in comparison with the conventional imaging photodetection device.

Further, in the conventional imaging photodetection device as shown in FIG. 17B, information for one color is detected through each of the microlenses. In contrast, in the imaging photodetection device of Embodiment 1, two kinds or more of color information are detected through each of the microlenses. Therefore, when the size of the microlenses 10 (or the internal microlenses 7a) is unified for comparison, it is possible in Embodiment 1 at least to double the pixel density in comparison with the conventional imaging photodetection device.

Furthermore, in the conventional imaging photodetection device as shown in FIG. 21, there has been a problem that the spectral action (difference in the refractive angle by wavelength) is small since the dispersion characteristics of a prism are used for the color separation of light. In contrast, in the imaging photodetection device of Embodiment 1, the spectral action (difference in the diffractive angle by wavelength) is large since a phase shift occurring on the wavefront of light (in other words, the mode shift occurring in the waveguide in which the central axis 14 is bent) is used. Accordingly, as shown in FIGS. 5A, 6A, and 7A, by setting the spacing between the tip of the transparent high refractive index section and the photodetection plane to 1 to 3 µm, a displacement of at least 0.5 µm can be provided between the three spots of the $0^{th}$-order diffracted light (green), the $1^{st}$-order diffracted light (red), and the $-1^{st}$-order diffracted light (blue), which is a sufficiently practical dimension in trial production.

Figure 12B:
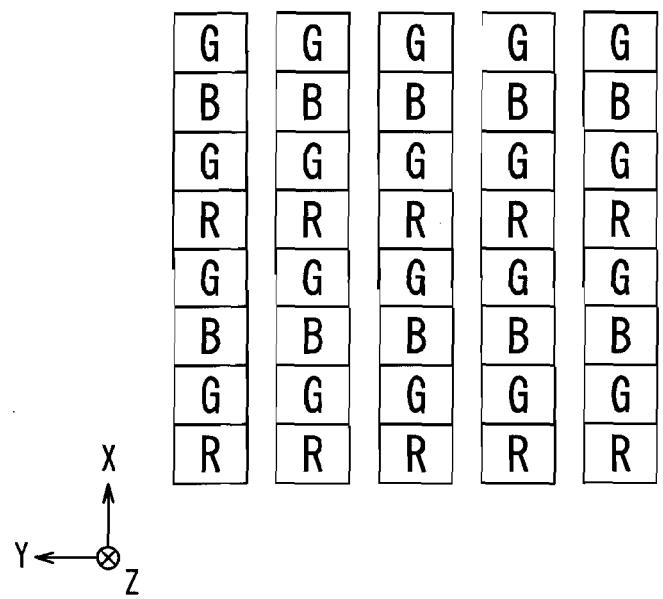
FIG. 12B is a view showing another example of an arrangement of photodetectors in the imaging photodetection device according to Embodiment 1 of the present invention.
Figure 12C:
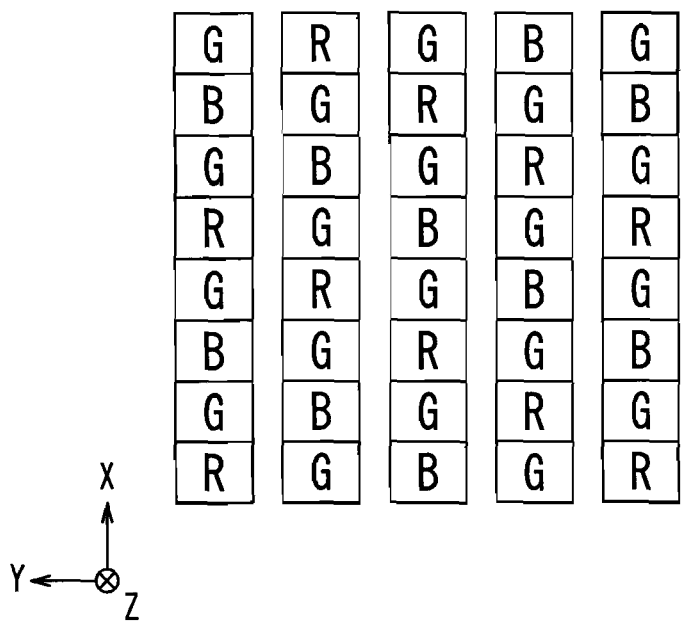
FIG. 12C is a view showing yet another example of an arrangement of photodetectors in the imaging photodetection device according to Embodiment 1 of the present invention.
Figure 12D:
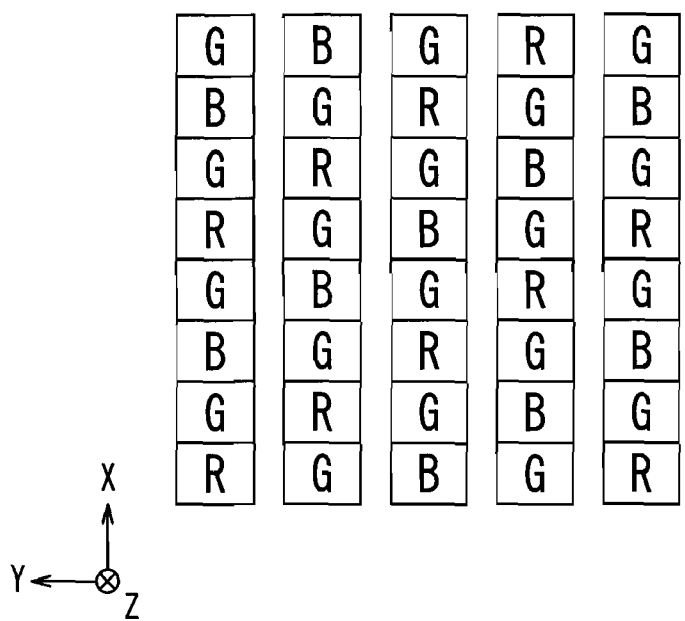
FIG. 12D is a view showing yet another example of an arrangement of photodetectors in the imaging photodetection device according to Embodiment 1 of the present invention.

The arrangements of the transparent high refractive index sections 13a and 13b and the photodetectors 6R, 6G, and 6B are not limited to those in FIGS. 11 and 12A, and can be variously changed. FIGS. 12B, 12C, and 12D are views showing other examples of the arrangement of the photodetectors 6R, 6G, and 6B as in FIG. 12A. In FIGS. 12B, 12C, and 12D, in a row of photodetectors along the X-axis direction, the photodetectors 6R, 6G, 6B, and 6G are aligned in this order, and this sequence is repeated, as in FIG. 12A. The rows of the photodetectors arranged along the X axis direction in this manner are sequentially arranged in the Y-axis direction while being shifted in the X-axis direction by 0 units in FIG. 12B, 0.5 units in FIG. 12C, and 1.5 units in FIG. 12D of the arrangement pitch in the X-axis direction of the transparent high refractive index sections (more specifically, the arrangement pitch in the X-axis direction of the portions of the transparent high refractive index sections having the width w2, that is, the arrangement pitch in the X-axis direction of the internal microlenses 7a).

Although not shown, the arrangement of the transparent high refractive index sections 13a and 13b for realizing the arrangement of the photodetectors 6R, 6G, and 6B as shown in FIGS. 12B, 12C, and 12D easily can be estimated from FIG. 11. That is to say, in all of FIGS. 12B, 12C, and 12D, the transparent high refractive index sections 13a and 13b are arranged alternately in a row of the transparent high refractive index sections in the X-axis direction as in FIG. 11. The rows of the transparent high refractive index sections arranged in this manner are arranged sequentially in the Y-axis direction while being shifted in the X-axis direction by 0 units in FIG. 12B, 0.5 units in FIG. 12C, and 1.5 units in FIG. 12D of the arrangement pitch in the X-axis direction of the transparent high refractive index sections (more specifically, the arrangement pitch in the X-axis direction of the portions of the transparent high refractive index sections having the width w2, that is, the arrangement pitch in the X-axis direction of the internal microlenses 7a). In FIGS. 12A and 12B, the positions in the X-axis direction of the transparent high refractive index sections match each other between the rows of the transparent high refractive index sections, and, thus, the transparent high refractive index sections can be shaped as plates continuous in the Y-axis direction. Furthermore, in FIG. 12B, the positions in the X-axis direction of the transparent high refractive index sections 13a and 13b match respectively between the rows of the transparent high refractive index sections, and, thus, the transparent high refractive index section can be shaped as plates in which their XZ cross-sectional shapes are constant in the Y-axis direction. In contrast, in FIGS. 12C and 12D, the positions in the X-axis direction of the microlenses 10 and the internal microlenses 7a are shifted between rows adjacent to each other in the Y-axis direction, by 0.5 units of the arrangement pitch thereof in the X-axis direction in accordance with the positions of the transparent high refractive index sections. That is to say, the microlenses 10 and the internal microlenses 7a that are circularly shaped when viewed parallel to the Z axis are arranged in a honeycomb. Accordingly, it is possible to reduce the arrangement pitch in the Y-axis direction of the microlenses 10, the transparent high refractive index sections 13, and the internal microlenses 7a so as to improve further the efficiency for utilization of light obtained from a photographic subject.

FIGS. 12A to 12D above show examples of the pixel array assuming that the three primary colors are detected. For example, in the case where the photodetector 6G and the photodetector 6R or the photodetector 6B are combined as described above to detect a primary color and a complementary color thereof, the arrangement of the photodetectors is different from that in FIGS. 12A to 12D, and can be variously set according to a desired pixel array.

Embodiment 2

Figure 13:
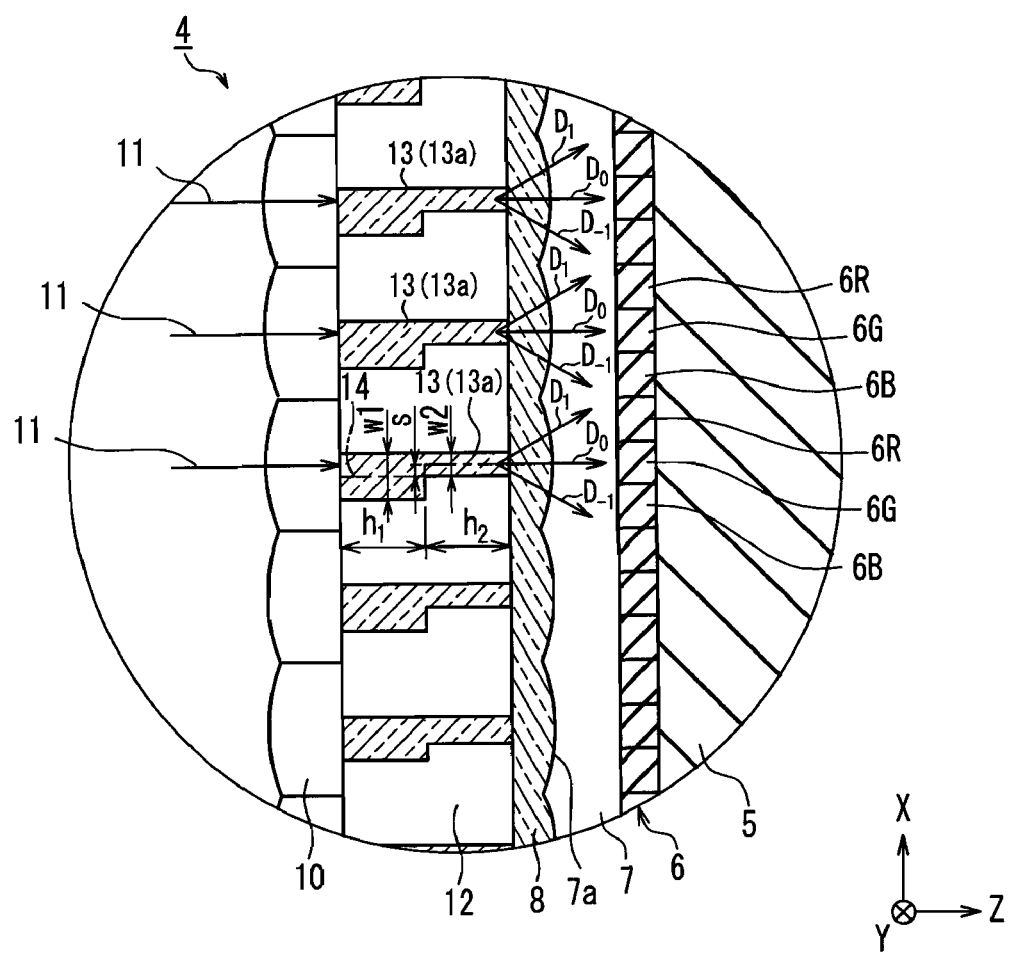
FIG. 13 is a magnified cross-sectional view of a portion XIII in FIG. 1, showing a schematic configuration of an imaging photodetection device according to Embodiment 2 of the present invention.
Figure 14:
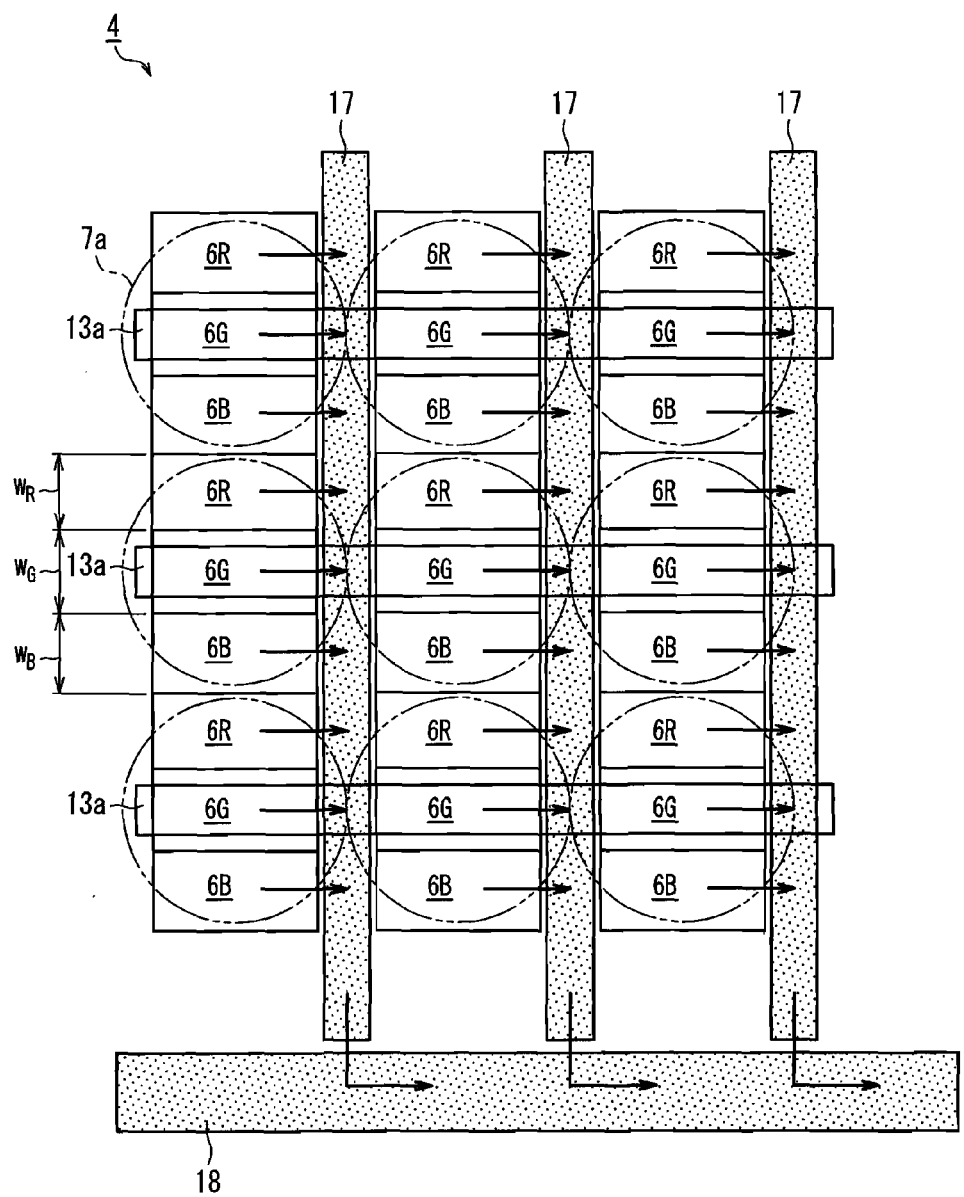
FIG. 14 is a magnified plan view of a photodetection plane, showing a planar arrangement of constituent elements of the imaging photodetection device according to Embodiment 2 of the present invention.
Figure 15A:
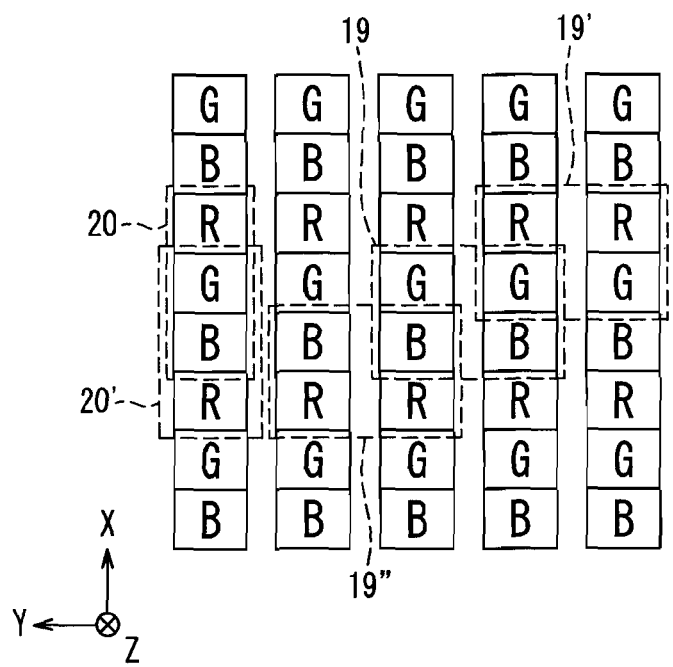
FIG. 15A is a view showing an example of an arrangement of photodetectors in the imaging photodetection device according to Embodiment 2 of the present invention.

FIG. 13 is a magnified cross-sectional view of a portion XIII in FIG. 1, showing a schematic configuration of the photodetection device 4 according to Embodiment 2 of the present invention. FIG. 14 is a magnified plan view of a photodetection plane, showing a planar arrangement of constituent elements of the photodetection device 4 according to Embodiment 2. FIG. 15A is a view showing the arrangement of the photodetectors 6R, 6G, and 6B in the photodetection device 4 shown in FIG. 14, as in FIG. 12A. In Embodiment 2, constituent elements common to those of Embodiment 1 are assigned the identical reference numerals, and a detailed description thereof is omitted.

As clearly seen from FIG. 13, Embodiment 2 is different from Embodiment 1 in which the central axes 14 are bent in the alternately opposite orientation, in that the central axes 14 of the transparent high refractive index sections 13 arranged along the X-axis direction are bent in the same orientation. On the XZ cross-section shown in FIG. 13, only the transparent high refractive index sections 13a are present, and the transparent high refractive index sections 13b are not present.

Since Embodiment 2 is different from Embodiment 1 in the arrangement of the transparent high refractive index sections 13 as described above, Embodiment 2 is different from Embodiment 1 also in the correspondence between the transparent high refractive index sections 13 and the photodetectors 6. That is to say, as clearly seen from FIG. 13, Embodiment 2 is different from Embodiment 1 in which two transparent high refractive index sections 13 correspond to each of the photodetectors 6R and 6B on both outer sides of the photodetectors 6R, 6G, and 6B adjacent to each other in the X-axis direction, in that one transparent high refractive index section 13 corresponds to the photodetectors 6R, 6G, and 6B adjacent to each other in the X-axis direction. In Embodiment 2, in the X-axis direction, the photodetectors 6R, 6G, and 6B are aligned in this order, and this sequence is repeated.

Referring to FIG. 14, in this example, the rows of the transparent high refractive index sections 13a arranged along the X-axis direction are repeatedly arranged in the Y-axis direction without being shifted in the X-axis direction. As a result, the transparent high refractive index sections 13a are arranged continuously along the Y-axis direction.

Furthermore, in the X-axis direction, the photodetectors 6R, 6G, and 6B are aligned in this order, and this sequence is repeated. The rows of the photodetectors arranged along the X-axis direction in this manner are arranged repeatedly in the Y-axis direction without being shifted in the X-axis direction. As a result, the photodetectors 6R, 6G, and 6B respectively are arranged adjacent to each other in the Y-axis direction. As in Embodiment 1, the photodetectors 6G respectively are arranged directly below the transparent high refractive index sections 13a (i.e., on the central axes of the internal microlenses 7a).

Referring to FIG. 15A, when a color pixel is configured with four basic pixels forming 2 columns×2 rows, a color pixel 19 is configured with two green pixels (basic pixels G) and two blue pixels (basic pixels B), and a color pixel 19' configured with two green pixels (basic pixels G) and two red pixels (basic pixels R) and a color pixel 19" configured with two blue pixels (basic pixels B) and two red pixels (basic pixels R) are formed at positions obtained by shifting in the X-axis direction or the Y-axis direction by half the size of the color pixel 19 (the size of a basic pixel). All of the color pixels 19, 19', and 19" lack any one of a green pixel, a blue pixel, and a red pixel, and do not form the Bayer array. However, when a color pixel is configured with three basic pixels continuous in the X-axis direction forming 1 column×3 rows, both of a color pixel 20 and a color pixel 20' that are shifted from the color pixel 20 by the size of a basic pixel include one green pixel, one blue pixel, and one red pixel. Accordingly, as in the case of the Bayer array, the resolution is improved to the size of a basic pixel.

The arrangements of the transparent high refractive index sections 13 and the photodetectors 6R, 6G, and 6B are not limited to those in FIGS. 14 and 15A, and can be changed variously. FIGS. 15B to 15F are views showing other examples of the photodetectors 6R, 6G, and 6B as in FIG. 15A.

Figure 15B:
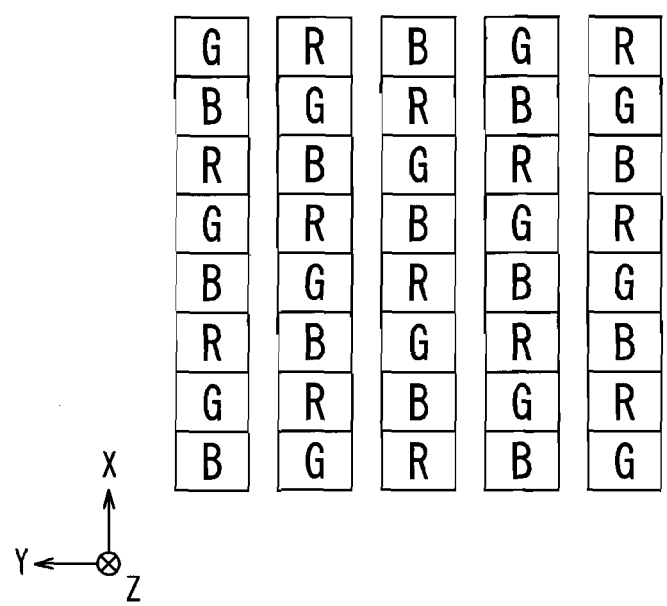
FIG. 15B is a view showing another example of an arrangement of photodetectors in the imaging photodetection device according to Embodiment 2 of the present invention.
Figure 15C:
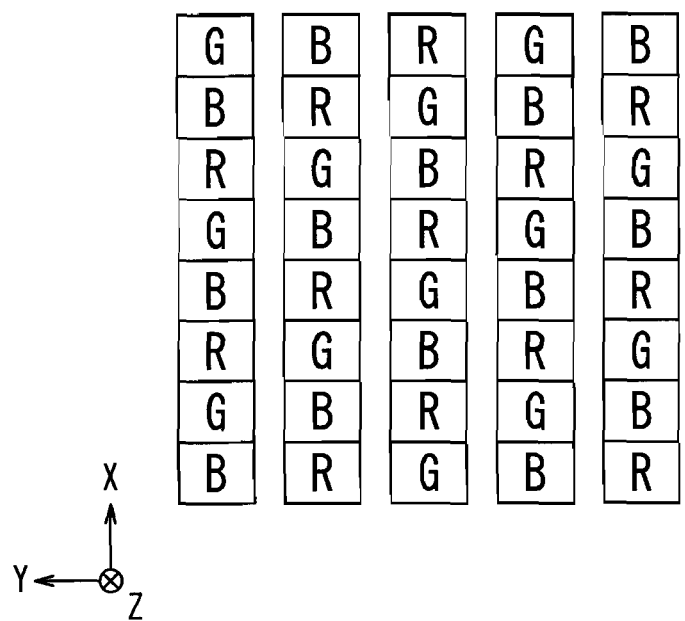
FIG. 15C is a view showing yet another example of an arrangement of photodetectors in the imaging photodetection device according to Embodiment 2 of the present invention.

In FIGS. 15B and 15C, in a row of photodetectors along the X-axis direction, the photodetectors 6R, 6G, and 6B are aligned in this order, and this sequence is repeated as in FIG. 15A. The rows of the photodetectors arranged along the X axis direction in this manner are sequentially arranged in the Y-axis direction while being shifted in the X-axis direction by ⅓ units in FIG. 15B and ⅔ units in FIG. 15C of the arrangement pitch in the X-axis direction of the transparent high refractive index sections (more specifically, the arrangement pitch in the X-axis direction of the portions of the transparent high refractive index sections having the width w2, that is, the arrangement pitch in the X-axis direction of the internal microlenses 7a). In FIGS. 15B and 15C, even when a color pixel is configured with three basic pixels continuous in the Y-axis direction forming 3 columns ×1 row, the resolution can be improved to the size of a basic pixel, as in the case of the color pixels 20 and 20' described in FIG. 15A.

Figure 15D:
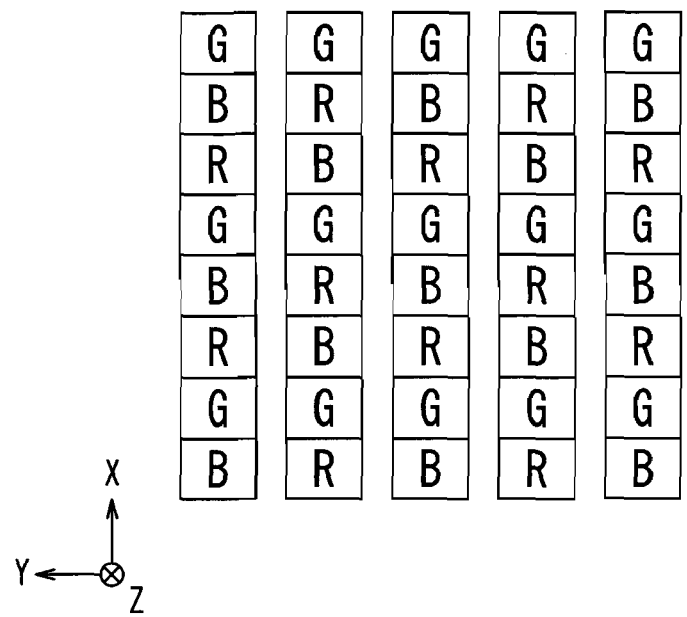
FIG. 15D is a view showing yet another example of an arrangement of photodetectors in the imaging photodetection device according to Embodiment 2 of the present invention.
Figure 15E:
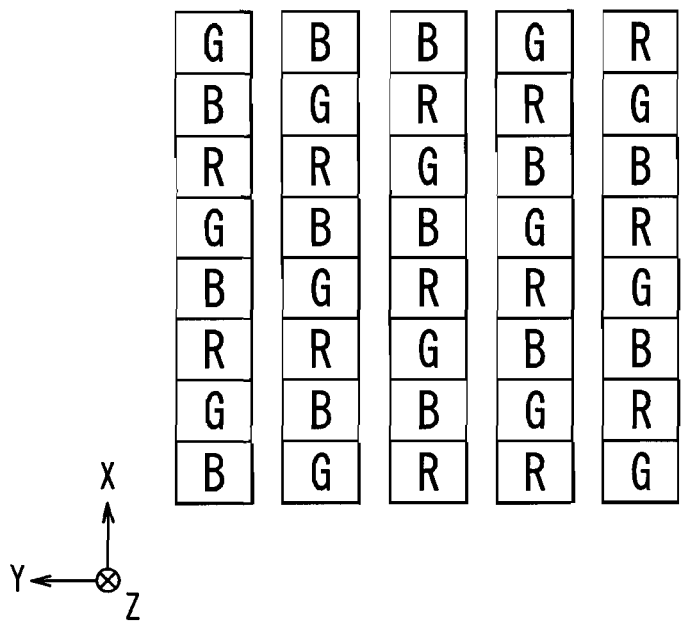
FIG. 15E is a view showing yet another example of an arrangement of photodetectors in the imaging photodetection device according to Embodiment 2 of the present invention.
Figure 15F:
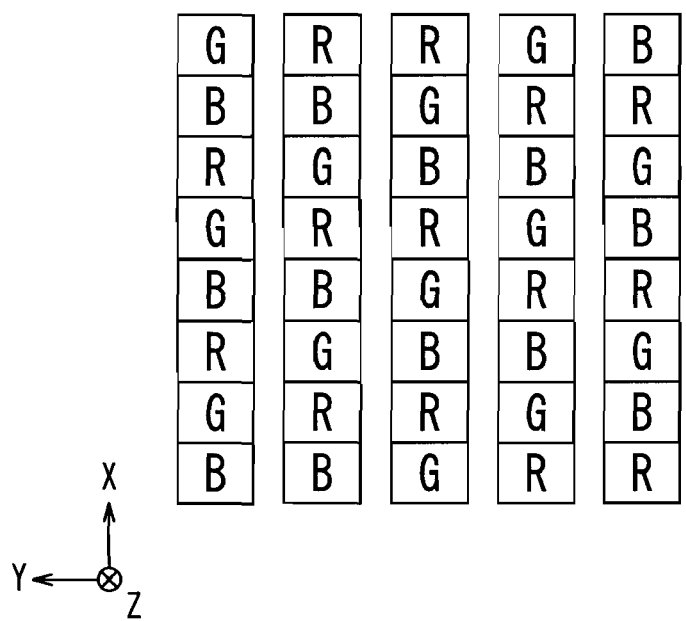
FIG. 15F is a view showing yet another example of an arrangement of photodetectors in the imaging photodetection device according to Embodiment 2 of the present invention.

In FIGS. 15D to 15F, rows in which the photodetectors 6R, 6G, and 6B are aligned in the X-axis direction in this order and in which this sequence is repeated, and rows in which the photodetectors 6B, 6G, and 6R are aligned in the X-axis direction in this order and in which this sequence is repeated are alternately arranged in the Y-axis direction. Furthermore, the rows of the photodetectors are sequentially arranged in the Y-axis direction while being shifted in the X-axis direction such that the position in the X-axis direction of the photodetector 6G is shifted in the X-axis direction between rows adjacent to each other in the Y-axis direction by 0 units in FIG. 15D, ⅓ units in FIG. 15E, and ⅔ units in FIG. 15F of the arrangement pitch in the X-axis direction of the transparent high refractive index sections (more specifically, the arrangement pitch in the X-axis direction of the portions of the transparent high refractive index sections having the width w2, that is, the arrangement pitch in the X-axis direction of the internal microlenses 7a).

Although not shown, the arrangement of the transparent high refractive index sections 13a and 13b for realizing the arrangement of the photodetectors 6R, 6G, and 6B as shown in FIGS. 15B to 15F can be estimated easily from FIG. 14. That is to say, in FIGS. 15B and 15C, the rows of the transparent high refractive index sections along the X-axis direction include only the transparent high refractive index sections 13a as in FIG. 14. The rows of the transparent high refractive index sections arranged in this manner are arranged sequentially in the Y-axis direction while being shifted in the X-axis direction by ⅓ units in FIG. 15B and ⅔ units in FIG. 15C of the arrangement pitch in the X-axis direction of the transparent high refractive index sections (more specifically, the arrangement pitch in the X-axis direction of the portions of the transparent high refractive index sections having the width w2, that is, the arrangement pitch in the X-axis direction of the internal microlenses 7a).

In FIGS. 15D to 15F, the rows in which only the transparent high refractive index sections 13a are arranged along the X-axis direction, and the rows in which only the transparent high refractive index sections 13b are arranged along the X-axis direction are alternately arranged in the Y-axis direction. Furthermore, the rows of the transparent high refractive index sections are arranged sequentially in the Y-axis direction while being shifted in the X-axis direction such that the positions of the transparent high refractive index sections 13a and 13b are shifted in the X-axis direction between rows adjacent to each other in the Y-axis direction by 0 units in FIG. 15D, ⅓ units in FIG. 15E, and ⅔ units in FIG. 15F of the arrangement pitch in the X-axis direction of the transparent high refractive index sections 13a and 13b (more specifically, the arrangement pitch in the X-axis direction of the portions of the transparent high refractive index sections having the width w2, that is, the arrangement pitch in the X-axis direction of the internal microlenses 7a).

In FIGS. 15A and 15D, the positions in the X-axis direction of the transparent high refractive index sections match each other between the rows of the transparent high refractive index sections, and, thus, the transparent high refractive index sections can be shaped as plates continuous in the Y-axis direction. Furthermore, in FIG. 15A, the central axes of the transparent high refractive index sections are bent in the same orientation between the rows of the transparent high refractive index sections, and, thus, the transparent high refractive index section can be shaped as plates in which their XZ cross-sectional shapes are constant in the Y-axis direction. In contrast, in FIGS. 15B, 15C, 15E, and 15F, the positions in the X-axis direction of the microlenses 10 and the internal microlenses 7a are shifted between rows adjacent to each other in the Y-axis direction, by ⅓ units or ⅔ units of the arrangement pitch in the X-axis direction in accordance with the positions of the transparent high refractive index sections. That is to say, the microlenses 10 and the internal microlenses 7a that are circularly shaped when viewed parallel to the Z axis are arranged substantially in a honeycomb. Accordingly, it is possible to reduce the arrangement pitch in the Y-axis direction of the microlenses 10, the transparent high refractive index sections 13, and the internal microlenses 7a so as to improve further the efficiency for utilization of light obtained from a photographic subject.

FIGS. 15A to 15F above show examples of the pixel array assuming that the three primary colors are detected. For example, in the case where the photodetector 6G and the photodetector 6R or the photodetector 6B are combined to detect a primary color and a complementary color thereof as described in Embodiment 1, the arrangement of the photodetectors is different from that in FIGS. 15A to 15D, and can be set variously according to a desired pixel array.

Embodiment 2 is the same as Embodiment 1 except for the above-described aspects, has effects similar to those described in Embodiment 1, and can be changed as described in Embodiment 1.

Embodiments 1 and 2 described above are preferable specific examples of the present invention. The present invention is not limited to those, and can be changed variously.

Any cross-sectional shape along the XZ plane of the transparent high refractive index section 13 is acceptable as long as the central axis 14 thereof is bent stepwise, and the shape is not limited to those described in Embodiments 1 and 2. For example, in the transparent high refractive index section 13 shown in Embodiments 1 and 2, one of both faces that define the widths w1 and w2 (the upper face in FIG. 3) has a flush surface on which a portion before the bent portion of the central axis 14 (the portion having the width w1) and a portion after the bent portion (the portion having the width w2) have no difference in level therebetween. However, as shown in FIG. 16A, one of both faces that define the widths w1 and w2 of the transparent high refractive index section 13 (the upper face in FIG. 16A) may be bent in the opposite orientation to the orientation of the bent portion of the central axis 14, and the other face (the lower face in FIG. 16A) may be bent in the same orientation as the orientation of the bent portion of the central axis 14. Alternatively, as shown in FIG. 16B, both faces that define the widths w1 and w2 of the transparent high refractive index section 13 (the upper and the lower faces in FIG. 16B) may be bent in the same orientation as the orientation of the bent portion of the central axis 14. Furthermore, the relationship between the width w1 of the portion before the bent portion of the central axis 14 and the width w2 of the portion after the bent portion may be w1=w2 as shown in FIG. 16C, or may be w1<w2 as shown in FIG. 16D. Furthermore, as shown in FIG. 16E, the central axis 14 may be bent gradually such that the bent portion of the central axis 14 occupies a certain region in the Z-axis direction. Furthermore, the width w1 of the portion before the bent portion of the central axis 14 does not have to be constant and may be changed, and, in a similar manner, the width w2 of the portion after the bent portion of the central axis 14 does not have to be constant and may be changed. Furthermore, the number of step-like bent portions of the central axis 14 does not have to be one, and may be two or more.

The transparent high refractive index sections 13 adjacent to each other in the Y-axis direction may be continuous at parts with each other while changing the length (dimension in the Z-axis direction) h1 or h2, or the orientation of the bent portion of the central axis 14, or they may be completely independent. When the transparent high refractive index sections 13 are provided independently, spaces between the adjacent transparent high refractive index sections 13 are filled with the transparent low refractive index layer 12.

Furthermore, in Embodiments 1 and 2 above, the transparent high refractive index sections 13 are in contact with the lower surfaces of the microlenses 10 in the Z-axis direction. Alternatively, the transparent high refractive index sections 13 and the microlenses 10 can be separated from each other. In such a case, a transparent low refractive index layer 12 can be provided therebetween.

Since the transparent high refractive index sections 13 have a function as a waveguide to guide incident light to the side of the photodetector 6 while suppressing the light from spreading, the microlenses 10 having the similar function can be omitted under certain conditions (actually, in the calculation according to wave optics in FIGS. 5A, 5B, 6A, 6B, 7A, and 7B, the microlenses 10 are omitted). However, since the transparent high refractive index sections 13 extend in the Y-axis direction, the effect as a waveguide in the Y-axis direction is insufficient. Therefore, in order to substitute the microlenses 10 with the transparent high refractive index sections 13, it is preferable to form cylindrical surfaces having central axes in the X-axis direction for every row of the transparent high refractive index sections, on at least the incident side surface of the transparent high refractive index sections 13 and of the transparent low refractive index layer 12.

In Embodiments 1 and 2, the photodetectors 6 are arrayed two-dimensionally along the X-axis direction and the Y-axis direction. Alternatively, the photodetectors 6 can be arrayed one-dimensionally. In such a case, the transparent high refractive index sections 13 are arrayed one-dimensionally along the array direction of the photodetectors 6.

Though Embodiments 1 and 2 refer to an example of using SiN as the material of the transparent high refractive index sections 13, the present invention is not limited to this example. For instance, high refractive index materials such as tantalum oxide and titanium oxide can be used. Even resin materials such as a polyimide resin, nano-composites and the like can be used as long as a difference in the refractive index of at least 0.2 can be ensured with respect to the transparent low refractive index layer 12.

In Embodiments 1 and 2, the case is described in which the $0^{th}$-order diffracted light $D_0$, the $1^{st}$-order diffracted light $D_1$, and the $-1^{st}$-order diffracted light $D_{-1}$ are light of three primary colors consisting of green, red, and blue, but at least one of the $0^{th}$-order diffracted light $D_0$, the $1^{st}$-order diffracted light $D_1$, and the $-1^{st}$-order diffracted light $D_{-1}$ may be light of a wavelength other than that of the three primary colors (e.g., infrared light).

Actually a light-shielding portion such as metal wires is interposed between the microlenses and photodetectors in the light-receiving regions of the conventional photodetection device as shown in FIGS. 17B and 19, and, thus, part of the light that enters the light-receiving region will be shielded by the light-shielding portion. The same can be said of the photodetection device described in Embodiments 1 and 2. Recently, however, backside-illumination-type solid-state image sensors have been developed, and such a solid-state image sensor can receive light on the whole surface of the light-receiving region without being influenced by the metal wires. The photodetection device of the present invention can improve the efficiency of light utilization as a result of performing the color separation by using optical diffraction. Therefore, application of the photodetection device of the present invention to a backside-illumination-type solid-state image sensor is considered to be effective since the efficiency of light utilization can be improved further.

The embodiment described above solely is intended to elucidate the technological content of the present invention, and the present invention is not limited to or by these specific examples alone. Various modifications are possible within the scope of the claims and the spirit of the invention, and the present invention should be interpreted broadly.

Industrial Applicability

The present invention can be applied to any fields without any particular limitations and can be utilized as a small and high-resolution imaging photodetection device for picking up an image of an object.

Description Of Symbols

1 Object
2 Lens system
3 Image
4 Photodetection device
5 Detection substrate
6, 6R, 6G, 6B Photodetector
7 Transparent low refractive index buffer layer
7a Internal microlens
8 Transparent high refractive index buffer layer
10 Microlens
11 Incident light beam
12 Transparent low refractive index layer 13, 13a, 13b Transparent high refractive index section
14 Central axis of transparent high refractive index section
$D_0$ $0^{th}$-Order diffracted light
$D_1$ $1^{st}$-Order diffracted light
$D_{-1}$ $-1^{st}$-Order diffracted light

The invention claimed is:
1. An imaging photodetection device, comprising:
a plurality of photodetectors that are arrayed on a substrate at least along a first direction;
a transparent low refractive index layer that is formed above the plurality of photodetectors; and
a plurality of columnar or plate-like transparent high refractive index sections that are embedded in the transparent low refractive index layer along the first direction;
wherein central axes of the transparent high refractive index sections are bent stepwise on a cross-section of the transparent high refractive index sections orthogonal to the substrate and along the first direction, wherein
light that enters the transparent low refractive index layer and one of the plurality of transparent high refractive index sections passes therethrough to be separated into $0^{th}$-order diffracted light, $1^{st}$-order diffracted light, and $-1^{st}$-order diffracted light, and
the $0^{th}$-order diffracted light, the $1^{st}$-order diffracted light, and the $-1^{st}$-order diffracted light obtained through separation performed by the transparent low refractive index layer and the one of the plurality of transparent high refractive index sections are detected by two or three photodetectors corresponding to the one of the plurality of transparent high refractive index sections and adjacent to each other in the first direction.

2. The imaging photodetection device according to claim 1, wherein, on the cross-section of the transparent high refractive index sections, a width of the transparent high refractive index sections changes between before and after a bent portion of the central axis, and a width of the transparent high refractive index sections on a side closer to the substrate than the bent portion of the central axis is smaller than a width of the transparent high refractive index sections on an opposite side thereto.

3. The imaging photodetection device according to claim 1, wherein the $0^{th}$-order diffracted light is detected by a first photodetector, the $1^{st}$-order diffracted light is detected by a second photodetector, and the $-1^{st}$-order diffracted light is detected by a third photodetector.

4. The imaging photodetection device according to claim 3, wherein, in the case where light that enters the transparent low refractive index layer and the transparent high refractive index section is white light, light that enters the first photodetector has a light amount peak in a green wavelength region of 0.50 µm to 0.60 µm, light that enters the second photodetector has a light amount peak in a red wavelength region of more than 0.60 µm, and light that enters the third photodetector has a light amount peak in a blue wavelength region of less than 0.50 µm.

5. The imaging photodetection device according to claim 4, wherein the first photodetector detects light in a deep layer region that does not include a surface thereof, the second photodetector detects light in a deep layer region that does not include a surface thereof, and the third photodetector detects light in a surface layer region that includes a surface thereof.

6. The imaging photodetection device according to claim 1, wherein the $0^{th}$-order diffracted light and the $1^{st}$-order diffracted light are detected by a first photodetector, and the $-1^{st}$-order diffracted light is detected by a second photodetector.

7. The imaging photodetection device according to claim 6, wherein, in the case where light that enters the transparent low refractive index layer and the transparent high refractive index section is white light, light that enters the first photodetector has a light amount peak in a wavelength region other than a blue wavelength region of at least 0.50 µm, and light that enters the second photodetector has a light amount peak in a blue wavelength region of less than 0.50 µm.

8. The imaging photodetection device according to claim 7, wherein the first photodetector detects light in a deep layer region that does not include a surface thereof, and the second photodetector detects light in a surface layer region that includes a surface thereof.

9. The imaging photodetection device according to claim 1, wherein the $1^{st}$-order diffracted light is detected by a first photodetector, and the $0^{th}$-order diffracted light and the $-1^{st}$-order diffracted light are detected by a second photodetector.

10. The imaging photodetection device according to claim 9, wherein, in the case where light that enters the transparent low refractive index layer and the transparent high refractive index section is white light, light that enters the first photodetector has a light amount peak in a red wavelength region of more than 0.60 µm, and light that enters the second photodetector has a light amount peak in a wavelength region other than a red wavelength region of not greater than 0.60 µm.

11. The imaging photodetection device according to claim 10, wherein the first photodetector detects light in a deep layer region that does not include a surface thereof, and the second photodetector detects light in a surface layer region that includes a surface thereof.

12. The imaging photodetection device according to claim 1, wherein the central axes of the plurality of transparent high refractive index sections arranged along the first direction are bent in an alternately opposite orientation,
three photodetectors adjacent to each other in the first direction correspond to each of the plurality of transparent high refractive index sections, and
two photodetectors on both outer sides of the three photodetectors arranged along the first direction correspond also to transparent high refractive index sections adjacent in the first direction to the transparent high refractive index section that corresponds to the three photodetectors.

13. The imaging photodetection device according to claim 12, wherein the transparent high refractive index sections are arranged along a plurality of rows parallel to the first direction, and
a position in the first direction of each of the transparent high refractive index sections forming the rows of the transparent high refractive index sections parallel to the first direction is shifted between two rows adjacent to each other in a second direction, which is orthogonal to the first direction, by 0 units, 0.5 units, 1 unit, or 1.5 units of an arrangement pitch in the first direction.

14. The imaging photodetection device according to claim 1, wherein the central axes of the plurality of transparent high refractive index sections arranged along the first direction are bent in a same orientation,
three photodetectors adjacent to each other in the first direction correspond to each of the plurality of transparent high refractive index sections, and
each of the plurality of photodetectors detects any one of the $0^{th}$-order diffracted light, the $1^{st}$-order diffracted light, and the $-1^{st}$-order diffracted light.

15. The imaging photodetection device according to claim 14, wherein the transparent high refractive index sections are arranged along a plurality of rows parallel to the first direction, the central axes in rows of the transparent high refractive index sections parallel to the first direction are bent in a same orientation in two rows adjacent to each other in a second direction, which is orthogonal to the first direction, and a position in the first direction of each of the transparent high refractive index sections forming the rows of the transparent high refractive index sections parallel to the first direction is shifted between two rows adjacent to each other in the second direction by 0 units, ⅓ units, or ⅔ units of an arrangement pitch in the first direction.

16. The imaging photodetection device according to claim 14, wherein the transparent high refractive index sections are arranged along a plurality of rows parallel to the first direction, the central axes in rows of the transparent high refractive index sections parallel to the first direction are bent in the opposite orientation in two rows adjacent to each other in a second direction, which is orthogonal to the first direction, and a position in the first direction of each of the transparent high refractive index sections forming the rows of the transparent high refractive index sections parallel to the first direction is shifted between two rows adjacent to each other in the second direction by 0 units, ⅓ units, or ⅔ units of an arrangement pitch in the first direction.

* * * * *